(12) United States Patent
Joo et al.

(10) Patent No.: US 8,187,790 B2
(45) Date of Patent: May 29, 2012

(54) POLYMER FOR RESIST AND RESIST COMPOSITION MANUFACTURED USING THE SAME

(75) Inventors: Hyunsang Joo, Daejeon (KR); Jinho Kim, Daejeon (KR); Yonghwa Hong, Cheonan-si (KR); Changsoo Lee, Seoul (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 0 days.

(21) Appl. No.: 12/416,973

(22) Filed: Apr. 2, 2009

(65) Prior Publication Data

US 2010/0081079 A1 Apr. 1, 2010

(30) Foreign Application Priority Data

Sep. 30, 2008 (KR) ........................ 10-2008-0096224

(51) Int. Cl.
*G03F 7/038* (2006.01)
*G03F 7/039* (2006.01)
*C08F 24/00* (2006.01)
*C08G 59/68* (2006.01)

(52) U.S. Cl. ................... 430/280.1; 430/270.1; 430/914; 430/921; 430/325; 430/326; 522/31

(58) Field of Classification Search ........................ None
See application file for complete search history.

(56) References Cited

U.S. PATENT DOCUMENTS

| | | | |
|---|---|---|---|
| 2002/0009668 A1* | 1/2002 | Nishimura et al. | 430/270.1 |
| 2002/0169266 A1* | 11/2002 | Funaki et al. | 526/281 |
| 2006/0134547 A1* | 6/2006 | Huang et al. | 430/270.1 |
| 2006/0160022 A1* | 7/2006 | Xu et al. | 430/270.1 |
| 2010/0035185 A1* | 2/2010 | Hagiwara et al. | 430/286.1 |
| 2010/0075256 A1* | 3/2010 | Joo et al. | 430/286.1 |

FOREIGN PATENT DOCUMENTS

| | | | |
|---|---|---|---|
| EP | 1662769 A1 * | 5/2006 | |
| JP | 2006-23489 A * | 1/2006 | |
| WO | WO 2008/099869 A * | 8/2008 | |

OTHER PUBLICATIONS

"hydrocargons", IUPAC GOLDBOOK, Compendium of Chemical Teminology, 2nd ed. compiled by McNaught et al, Blacwell Scientific Pulications, Oxford (1997, XML on-line corrected version: http:..goldbook.iupac.org (2006-0 created by Nic, et al last updated Sep. 7, 2009, 2 pages.*

"olefins", IUPAC GOLDBOOK, Compendium of Chemical Teminology, 2nd ed. compiled by McNaught et al, Blacwell Scientific Pulications, Oxford (1997, XML on-line corrected version: http:..goldbook.iupac.org (2006-0 created by Nic, et al last updated Sep. 7, 2009., 2 pages.*

"olefin" , Hawley's Condensed Chemical Dictionary , 14th edition, copyright 2002, by John Wiley & Sons, inc.three pages.*

English translation of JP, 2006-023489, A (2006) from machine translation from AIPN Japan Patent Office National center for Industrial Property Information and Training, generated Jun. 8, 2010, 70 pages.*

Grant et al , "compound" from Grant & Hackh's Chemical Dictionary, fifth edition, McGraw-Hill Book Company , New York, NY, 1987 p. 148.*

* cited by examiner

*Primary Examiner* — Cynthia Hamilton
(74) *Attorney, Agent, or Firm* — Ladas & Parry LLP

(57) ABSTRACT

Disclosed are a polymer for a chemically amplified resist represented as

[Chemical formula 1]

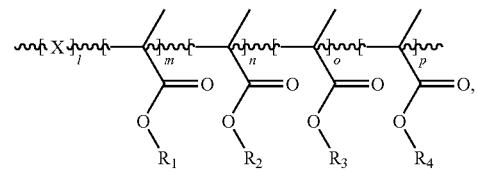

and a resist composition using the same. In the above Chemical formula 1, X represents vinyl ether derivatives or olefin derivatives, at least one of $R_1$, $R_2$, $R_3$, and $R_4$ is an alkyl group with 1 to 30 carbon atoms containing at least one functional group of a hydrogen atom, an ether group, an ester group, a carbonyl group, an acetal group, an epoxy group, a nitryl group (—CN), and an aldehyde group, l, m, n, o and p respectively represent repeating units, l represents a real number of 0.05 to 0.5, m and n respectively represent real numbers of 0.1 to 0.7, o and p respectively represent real numbers of 0 to 0.7, and a sum of l, m, n, o and p is 1.

6 Claims, 25 Drawing Sheets

<Run Conditions>
System: T60A + External RI
Columns: G4000Hhr+G2500Hhr
Solvent: THF
Flow Rate: 1.000 mL/min
Concentration: 0.000 mg/mL
Inj. Vol.: 100.0 uL
Analyst: Hong Yong Hwa <GPC Data Summary>
Mn : 3,990    Pd: 1.96
Mw: 7,810    Mp: 7,860
Mz: 12,600
% Below 1,000: 73.4
% Above 20,000: 0.0

POLYMER FOR RESIST AND RESIST COMPOSITION MANUFACTURED USING THE SAME

CROSS-REFERENCE TO RELATED APPLICATION

This application claims the benefit of Korean Patent Application No. 10-2008-0096224, filed on Sep. 30, 2008 in the Korean Intellectual Property Office, the entire disclosure of which is incorporated herein by reference.

BACKGROUND OF THE INVENTION

1. Field of the Invention

The present invention relates to a polymer for resist and a resist composition manufactured by using the same, and particularly, to a new polymer used in manufacturing a resist suitable for microfabrication performed using a far-ultraviolet such as KrF excimer laser, ArF excimer laser, and the like, and various radiations such as an X-ray of synchrotron radiation and charged particle beam of electron beam (e-beam), and a resist composition containing the same.

2. Description of Related Art

Recently, with a trend of high integration of a semiconductor device, demands for an ultra fine pattern of 0.10μ or less in manufacturing an ultra-large scale integrated circuit (ULSI) are increased, and accordingly a study for lithography using a far-ultraviolet, KrF excimer laser, ArF excimer laser, an extreme ultra violet (EUV), and an electron beam is gaining attention because they have a shorter exposure wavelength in comparison to a conventional g-ray or i-ray. Particularly, a light source gaining most attention in a next generation lithography requiring a pattern of 0.10μ or less may be the ArF excimer laser and EUV layer.

The above-mentioned resist composition may include a polymer having an acid-labile functional group, an acid generator for generating an acid by irradiation, and a solvent, and further include various additives as necessary. The polymer used as a main material of the resist is required to minimize light absorption of the exposure wavelength. A conventional chemically amplified resist used in the ArF excimer laser may generally use an acrylic polymer as the main materials, however, may disadvantageously exhibit relatively low dry plasma etching resistance due to a large amount of oxygen atoms within the polymer. In a case of having relatively low etching resistance, a thickness of a resist pattern is required to be increased. However, stability of the resist pattern may be deteriorated when the thickness of the resist pattern is increased.

SUMMARY OF THE INVENTION

An aspect of the present invention provides a polymer for a chemically amplified resist that may be excellent in etching resistance and in solubility with respect to a resist solvent.

An aspect of the present invention provides a composition for a chemically amplified resist that may be manufactured using the polymer, and form a resist pattern excellent in transparency, sensitivity, resolution, and developing property.

According to an aspect of the present invention, there is provided a polymer for a chemically amplified resist represented as

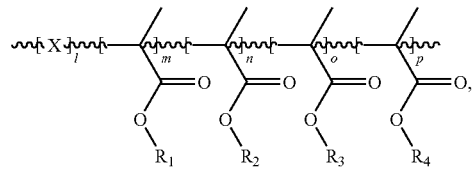

[Chemical formula 1]

wherein, X represents vinyl ether derivatives or olefin derivatives, at least one of $R_1$, $R_2$, $R_3$, and $R_4$ is an alkyl group with 1 to 30 carbon atoms containing at least one functional group of a hydrogen atom, an ether group, an ester group, a carbonyl group, an acetal group, an epoxy group, a nitryl group (—CN), and an aldehyde group, l, m, n, o and p respectively represent repeating units, l represents a real number of 0.05 to 0.5, m and n respectively represent real numbers of 0.1 to 0.7, o and p respectively represent real numbers of 0 to 0.7, and a sum of l, m, n, o and p is 1.

According to an aspect of the present invention, there is provided a composition for a chemically amplified resist comprising:

100 parts by weight of a polymer represented as

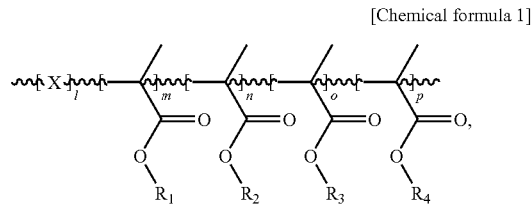

[Chemical formula 1]

0.5 to 15 parts by weight of an acid generator;
0.01 to 5 parts by weight of a basic additive; and
500 to 3000 parts by weight of a solvent, wherein, X represents vinyl ether derivatives or olefin derivatives, at least one of $R_1$, $R_2$, $R_3$ and $R_4$ is an alkyl group with 1 to 30 carbon atoms containing at least one functional group of a hydrogen atom, an ether group, an ester group, a carbonyl group, an acetal group, an epoxy group, a nitryl group (—CN), and an aldehyde group, l, m, n, o and p respectively represent repeating units, l represents a real number of 0.05 to 0.5, m and n respectively represent real numbers of 0.1 to 0.7, o and p respectively represent real numbers of 0 to 0.7, and a sum of l, m, n, o and p is 1.

BRIEF DESCRIPTION OF THE DRAWING

The above and other aspects of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS

Figure 1:
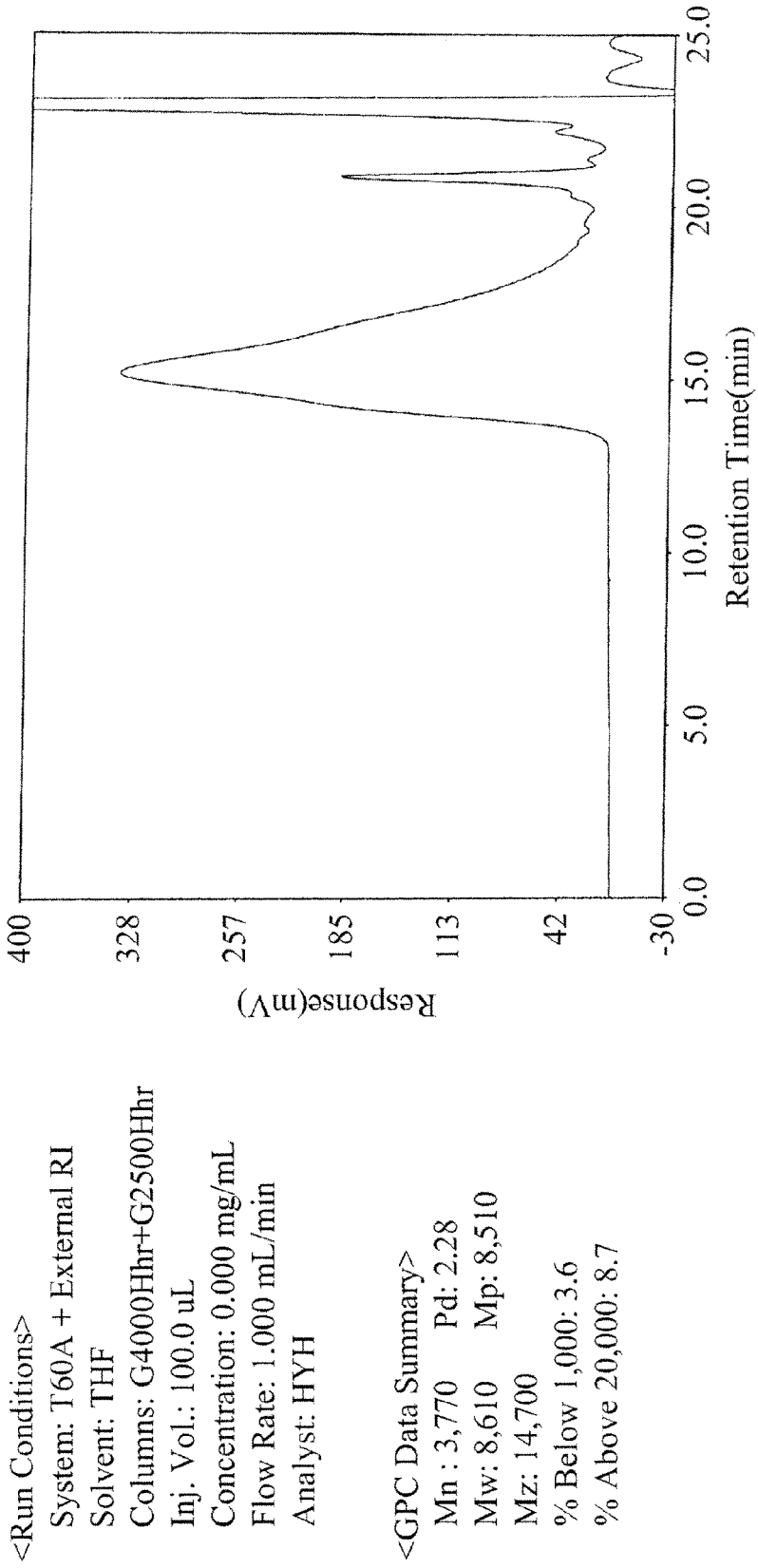
FIG. 1 is a diagram illustrating Gel Permission Chromatography (GPC) data after reaction of a comparative synthesis example according to Equation 2.

Reference will now be made in detail to exemplary embodiments of the present invention, examples of which are illustrated in the accompanying drawing, wherein like reference numerals refer to the like elements throughout. The exemplary embodiments are described below in order to explain the present invention by referring to the figure.

A composition for a chemically amplified resist according to an exemplary embodiment of the present invention may include a polymer for a chemically amplified resist, a basic additive, and a solvent.

Hereinafter, each element included in the composition will be described in detail.

Polymer

The polymer according to the present exemplary embodiment may have methacrylate and olefin monomers as repeating units. Vinyl ether may be added to synthesize the polymer, as necessary. Also, the polymer may be generally insoluble or poorly soluble with respect to an aqueous alkaline solution, however may be soluble in a certain case. Also, the polymer may have an acid-labile functional group in its side chain, however, may not have the functional group in a certain case. Solubility of monomers within the polymer may be increased or reduced depending on types and weight change of the monomers. In general, solubility with respect to the aqueous alkaline solution may be deteriorated as a hydrophobic group increases. The polymer is a multi copolymer represented as

[Chemical formula]

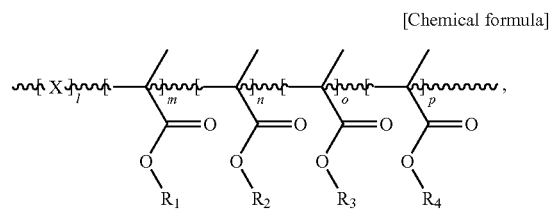

wherein X represents vinyl ether derivatives or olefin derivatives, at least one of $R_1$, $R_2$, $R_3$, and $R_4$ is an alkyl group with 1 to 30 carbon atoms containing at least one functional group of a hydrogen atom, an ether group, an ester group, a carbonyl group, an acetal group, an epoxy group, a nitryl group (—CN), and an aldehyde group, l, m, n, o and p respectively represent repeating units, l represents a real number of 0.05 to 0.5, m and n respectively represent real numbers of 0.1 to 0.7, o and p respectively represent real numbers of 0 to 0.7, and a sum of l, m, n, o and p is 1.

Preferably, at least one of the olefin derivatives does not include a functional group of an electron withdrawing group in a double bond location. Also, as the electron withdrawing group, a halogen group, —CN, a nitro group (—NO$_2$), a trifluoromethyl group (—CF$_3$), a sulfonyl group (—SO$_2$), and the like may be used.

Typically, a reaction between olefin and methacrylate represented as Equation 1 below may be poorly performed, and thus a polymer including only methacrylate may exist. However, the polymer according to the present exemplary embodiment may include a partial reaction between the olefin and methacrylate. The polymer according to the present exemplary embodiment may have much difference in physical properties in comparison with a copolymer including only the methacrylate.

[Equation 1]

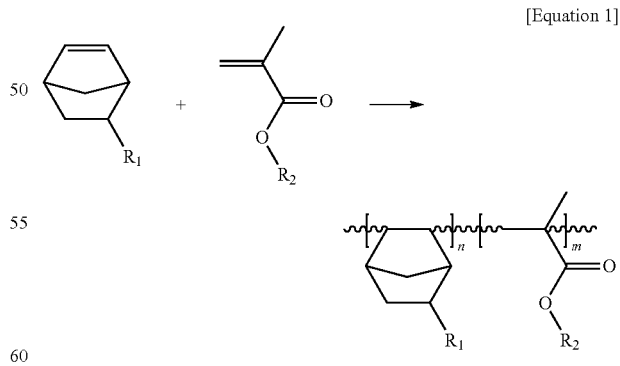

Characteristic Evaluation of Olefin-Containing Polymer

A polymer (a comparative polymer) including only methacrylate generated by Equation 2 below and a norbornene-containing polymer generated by Equation 3 below (a polymer of the present invention) are synthesized, and then resist characteristics are observed.

[Equation 2]

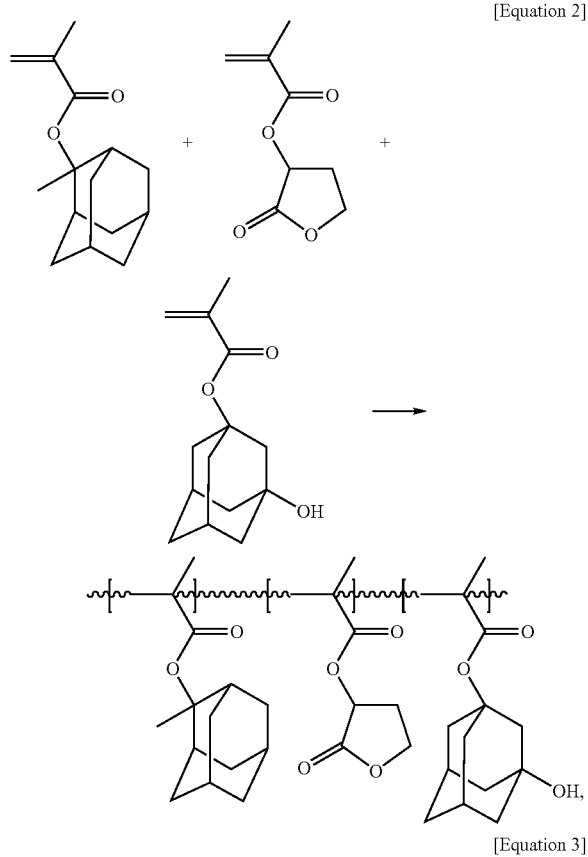

[Equation 3]

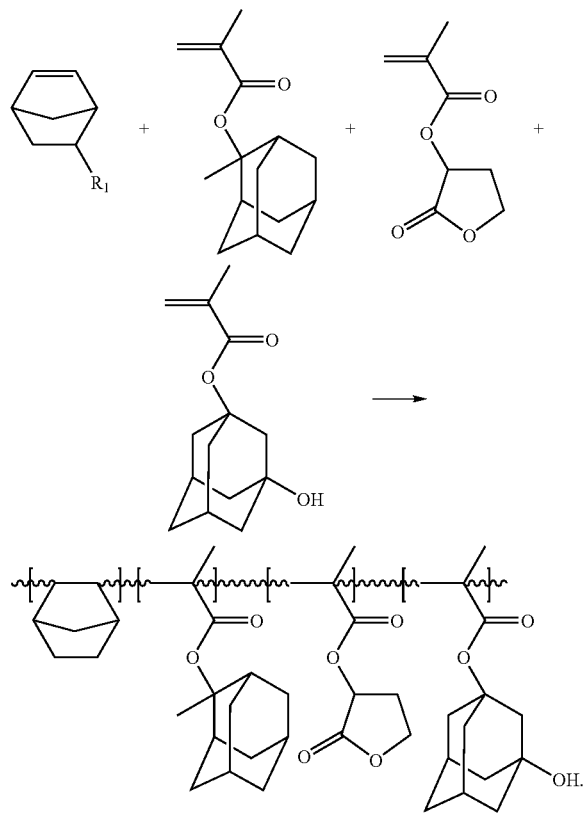

1. Comparative Polymer
  (1) Gel Permeation Chromatography (GPC) of solution after reaction: molecular weight 8,610, Pd 2.28, % below 1,000 3.6, % above 20,000 8.7
  (2) GPC of a solid after precipitation: molecular weight 9,120, Pd 2.16, % below 1,000 2.7, % above 20,000 9.8
  (3) DSC analysis (Tg): ND
  (4) TGA analysis: onset temperature 205.9° C.
  (5) NMR analysis: difficult to find a specific peak by norbornene
  (6) polymerization yield: 85%
2. Polymer of the Present Invention
  (1) GPC of solution after reaction: molecular weight 6,230, Pd 2.41, % below 1,000 8.5, % above 20,000 3.8
  (2) GPC of solid after precipitation: molecular weight 8,880, Pd 1.86, % below 1,000 1.3, % above 20,000 8.1
  (3) DSC analysis (Tg): ND
  (4) TGA analysis: onset temperature 208.4° C.
  (5) NMR analysis: difficult to find a specific peak by norbornene
  (6) polymerization yield: 69%

Various data (GPC, DSC, TGA, NMR) about the comparative polymer and the polymer of the present invention is illustrated in drawings.

Figure 2:
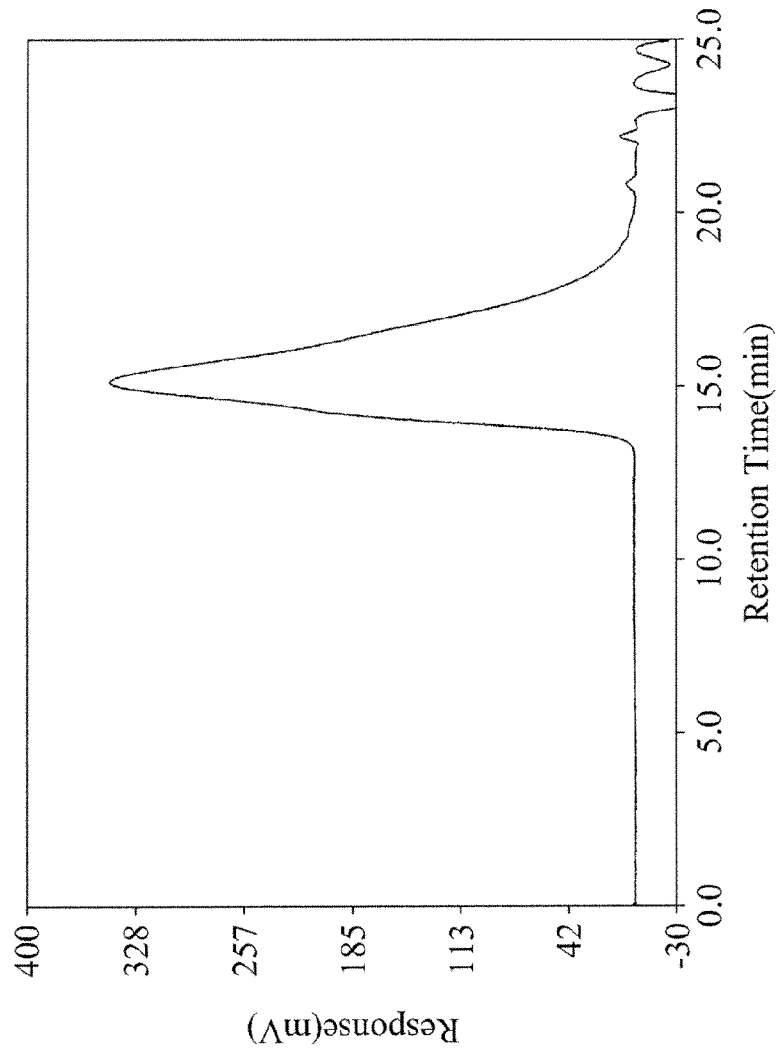
FIG. 2 is a diagram illustrating GPC data after precipitation of a comparative synthesis example according to Equation 2.
Figure 3:
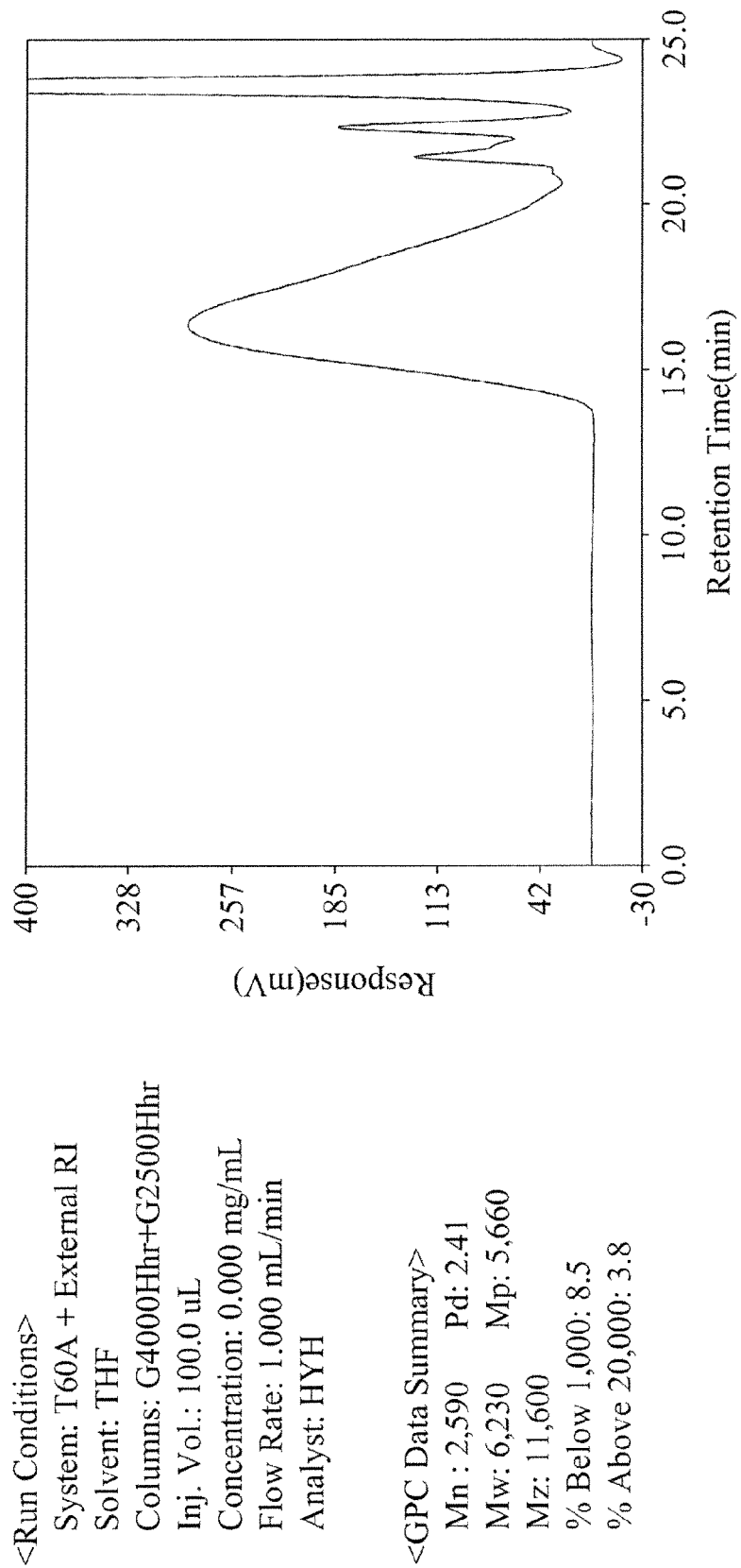
FIG. 3 is a diagram illustrating GPC data after reaction of a synthesis example according to Equation 3.
Figure 4:
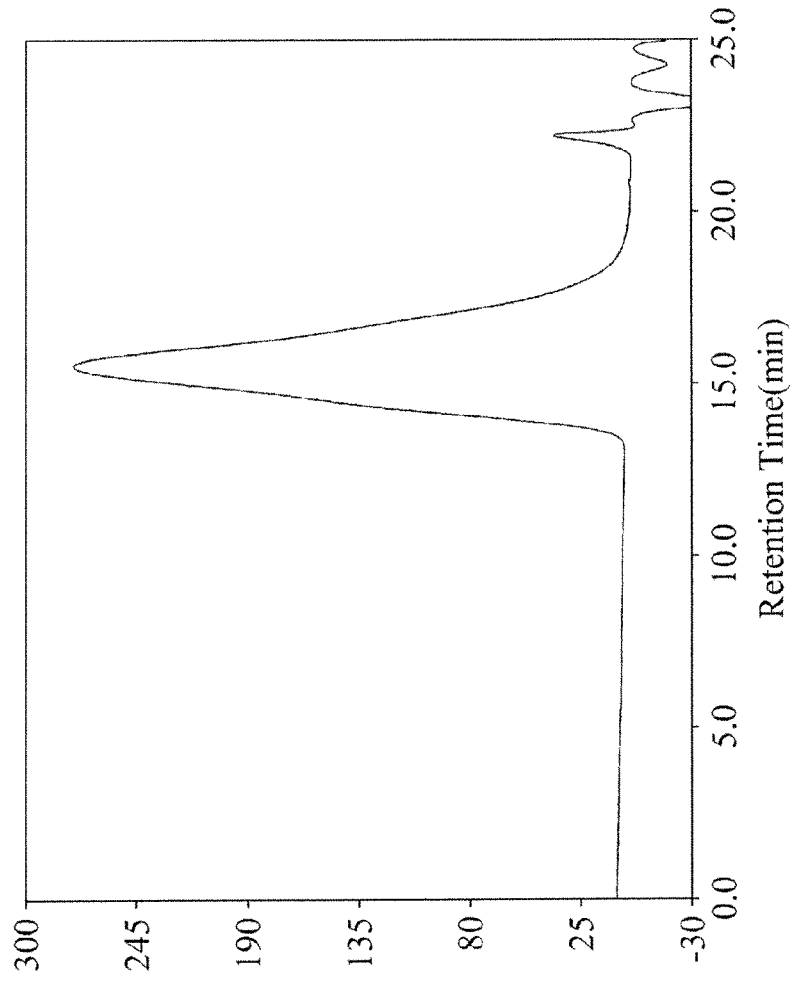
FIG. 4 is a diagram illustrating GPC data after precipitation of a comparative synthesis example according to Equation 3.
Figure 5:
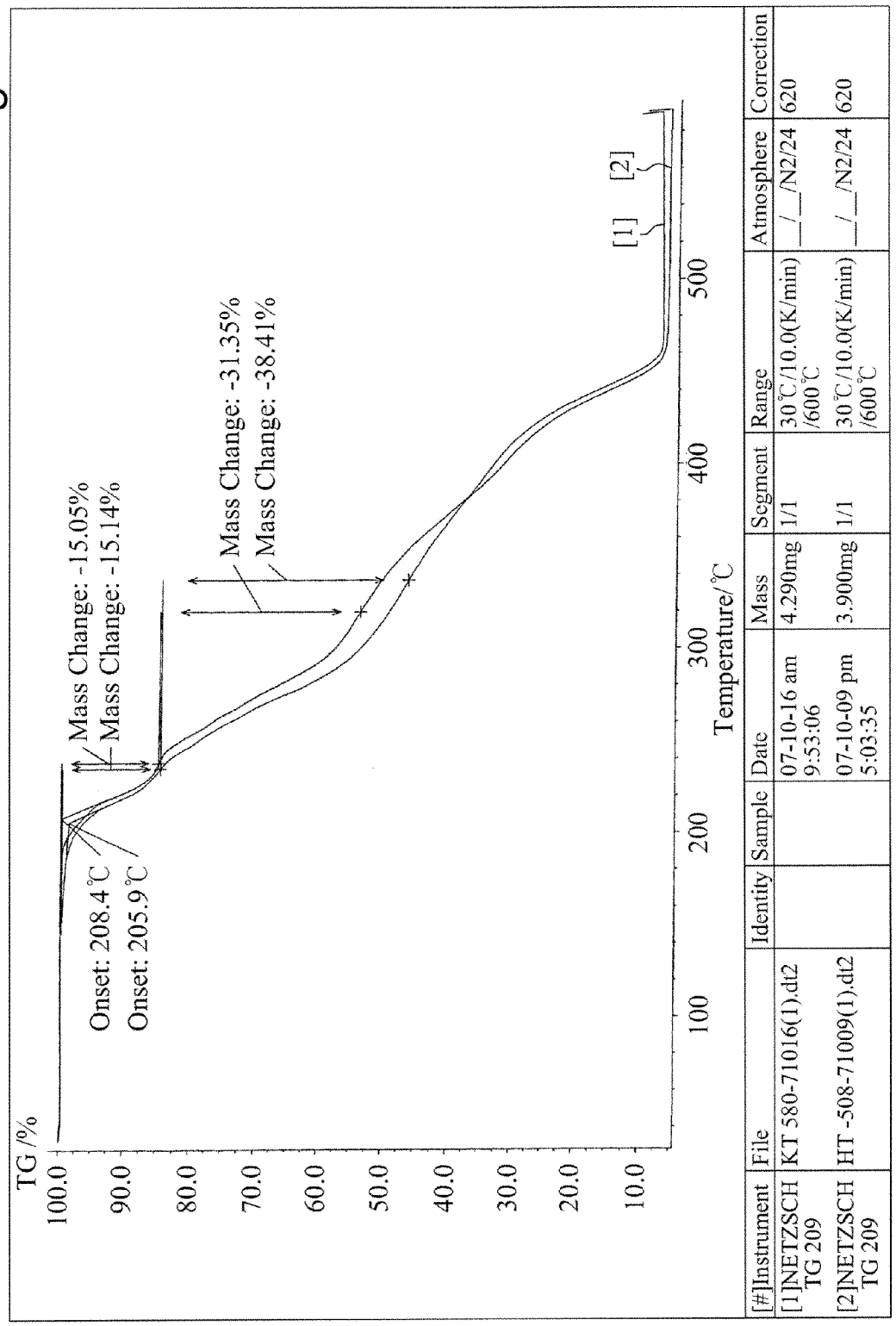
FIG. 5 is a diagram illustrating ThermoGravimetric analysis (TGA) data of a polymer synthesized according to a comparative synthesis example and a synthesis example.
Figure 6:
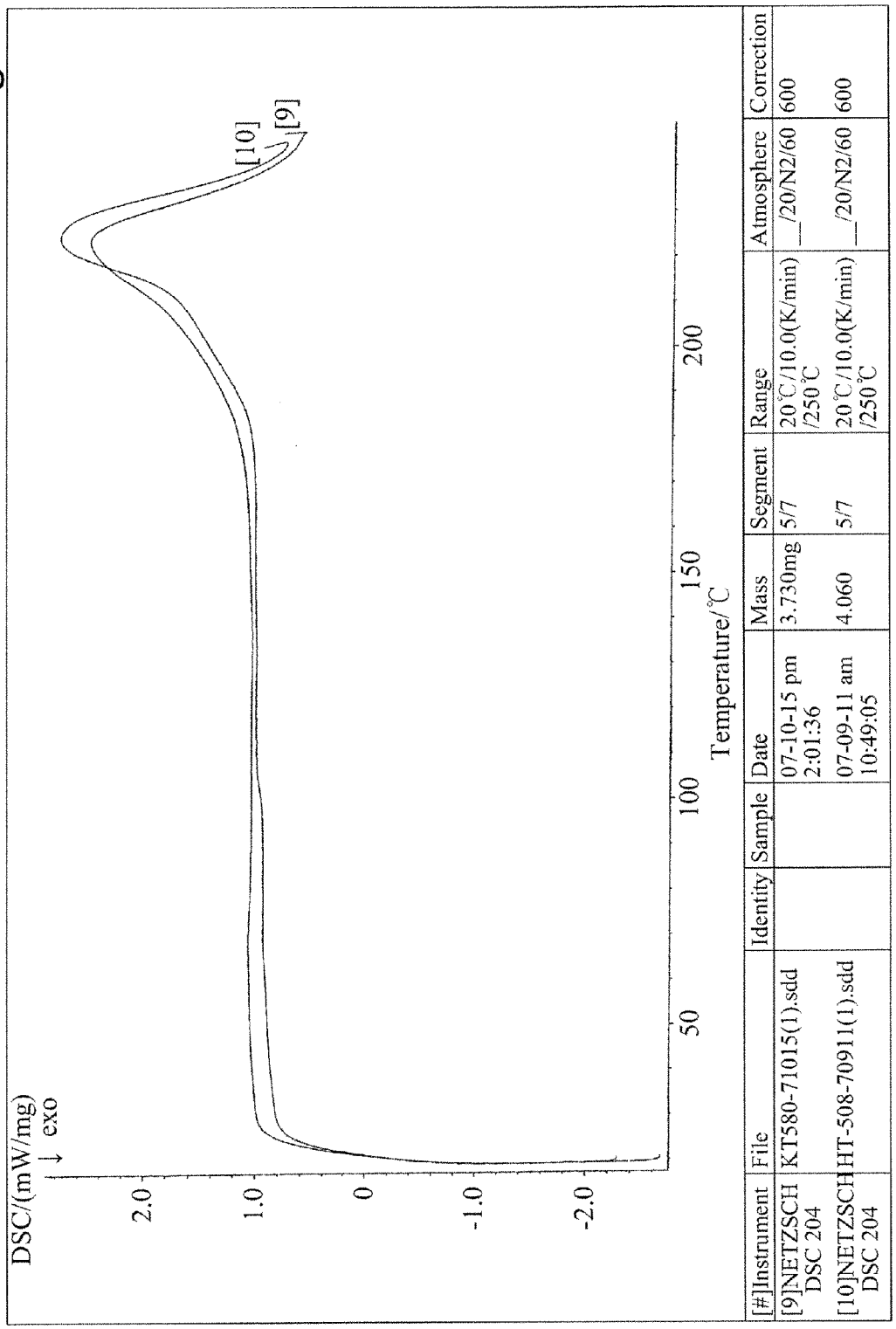
FIG. 6 is a diagram illustrating Differential Scanning Calorimetry (DSC) data of a polymer synthesized according to a comparative synthesis example and a synthesis example.

FIG. 1 is a diagram illustrating GPC data after reaction of a comparative synthesis example according to Equation 2, FIG. 2 is a diagram illustrating GPC data after precipitation of a comparative synthesis example according to Equation 2, FIG. 3 is a diagram illustrating GPC data after reaction of a synthesis example according to Equation 3, FIG. 4 is a diagram illustrating GPC data after precipitation of a comparative synthesis example according to Equation 3, FIG. 5 is a diagram illustrating TGA data of a polymer synthesized according to a comparative synthesis example and a synthesis example, and FIG. 6 is a diagram illustrating DSC data of a polymer synthesized according to a comparative synthesis example and a synthesis example. In FIGS. 5 and 6, data [1] is associated with Equation 2, and data [2] is associated with Equation 3.

Figure 7:
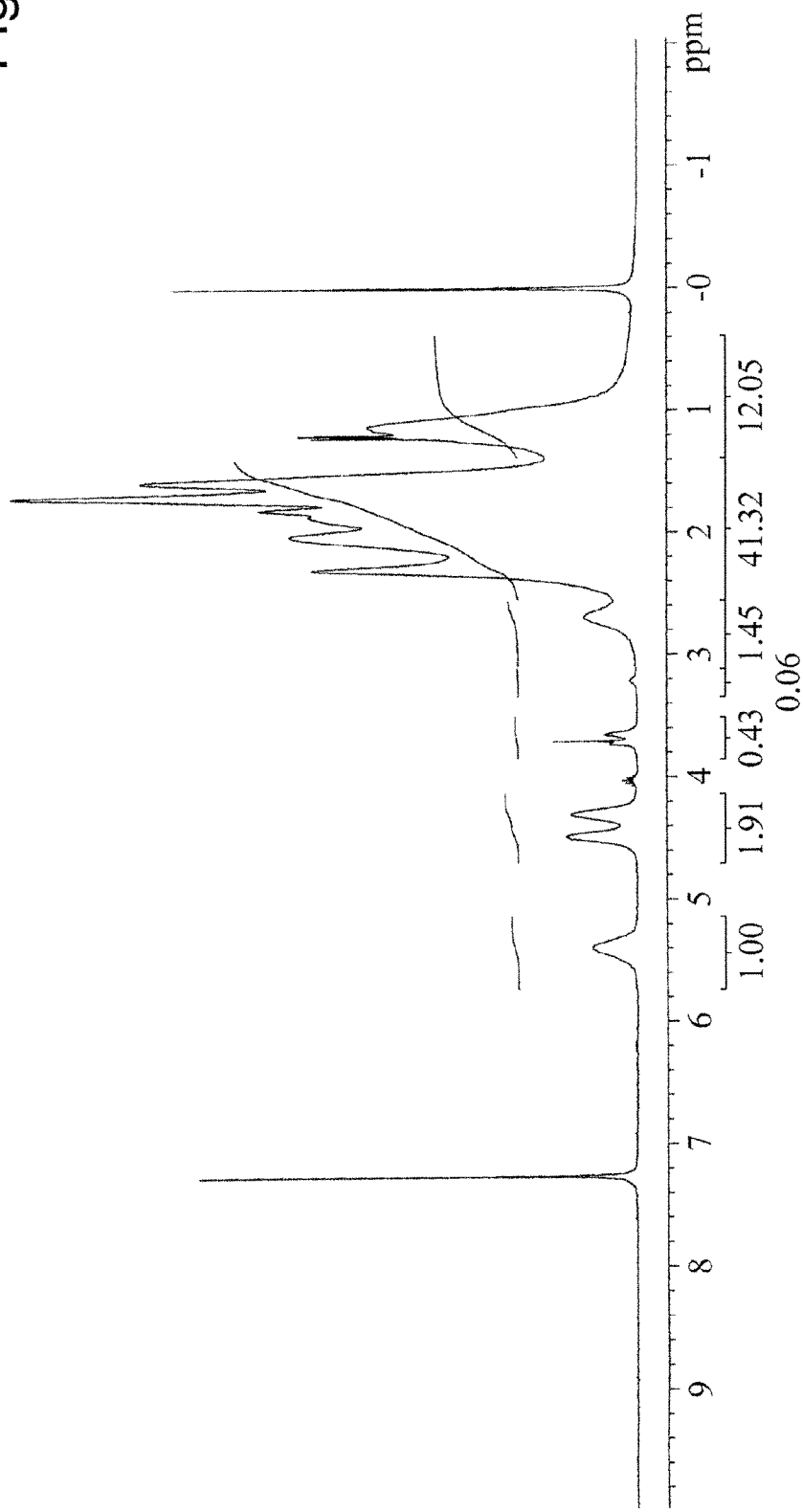
FIG. 7 is a diagram illustrating Nuclear Magnetic Resonance (NMR) data of a polymer synthesized according to a comparative synthesis example.
Figure 8:
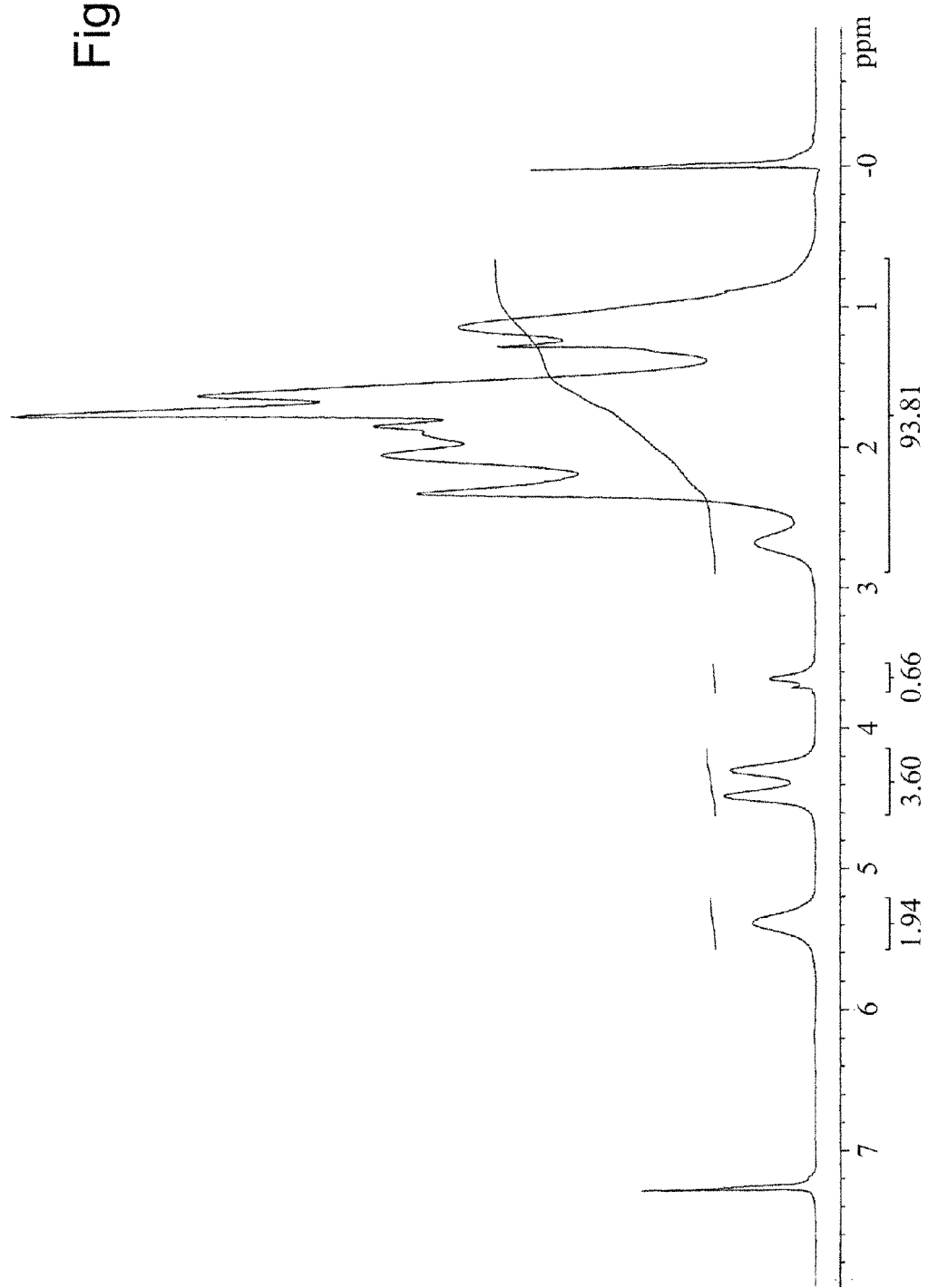
FIG. 8 is a diagram illustrating NMR data of a polymer synthesized according to a synthesis example.
Figure 9:
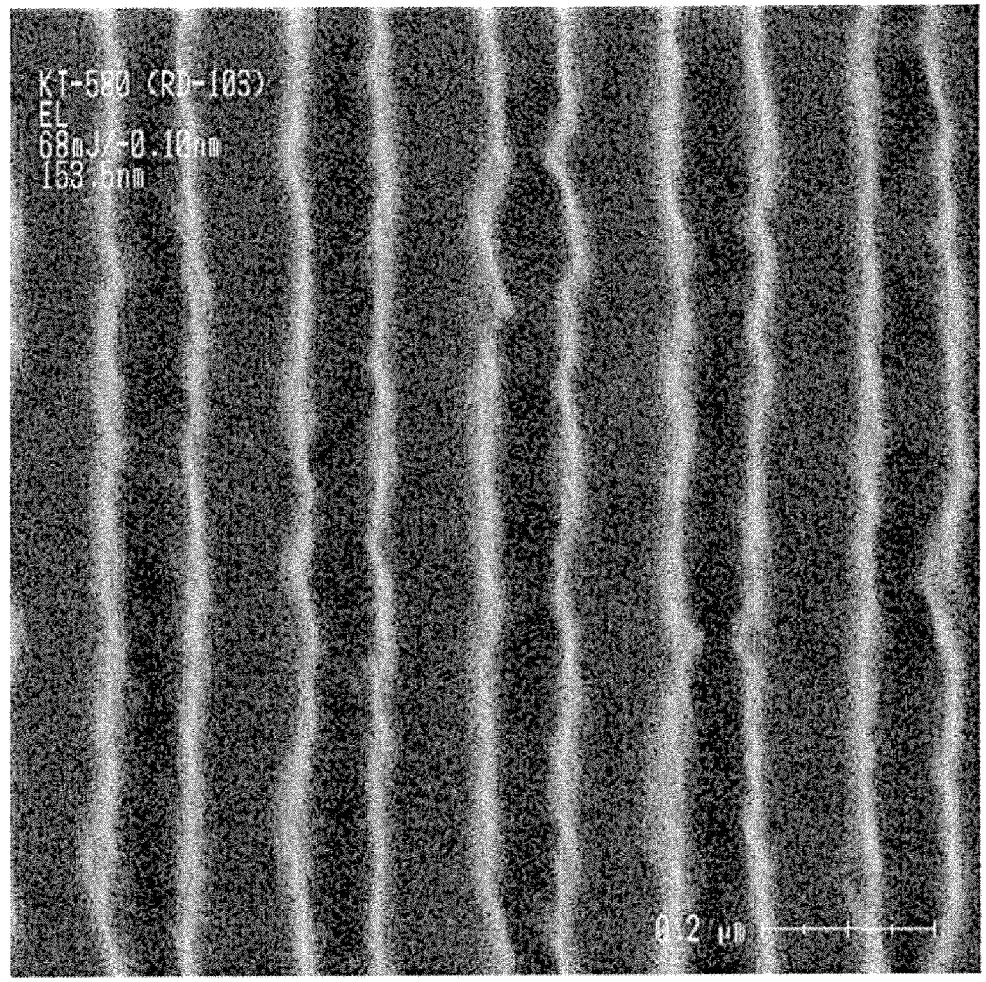
FIG. 9 is a critical-dimension-measurement scanning electron microscope (CD-SEM) photo of a resist using a polymer synthesized according to Equation 2.
Figure 10:
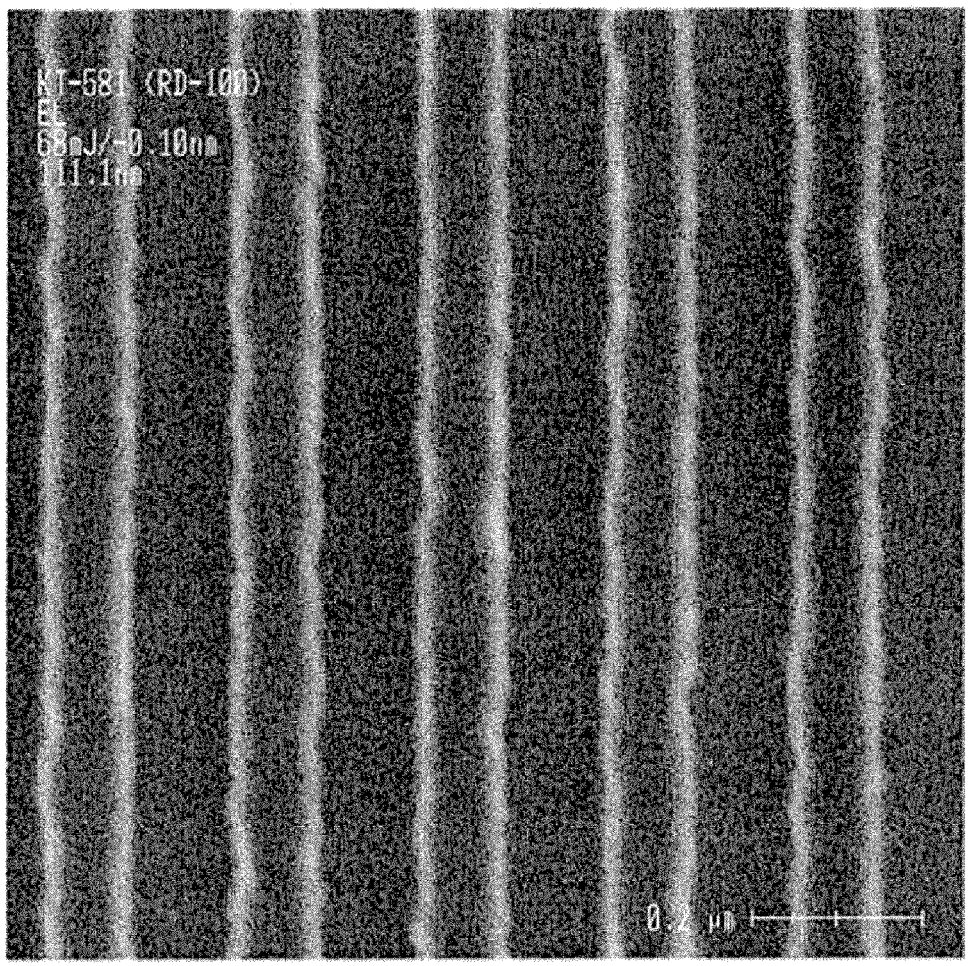
FIG. 10 is a CD-SEM photo of a resist using a polymer synthesized according to Equation 3.

FIG. 7 is a diagram illustrating NMR data of a polymer synthesized according to a comparative synthesis example, FIG. 8 is a diagram illustrating NMR data of a polymer synthesized according to a synthesis example, FIG. 9 is a critical-dimension-measurement scanning electron microscope (CD-SEM) photo of a resist using a polymer synthesized according to Equation 2, and FIG. 10 is a CD-SEM photo of a resist using a polymer synthesized according to Equation 3.

A resist characteristic estimation is performed under conditions as below.

Estimation condition: 0.78NA, SOB/FEB=110° C./110° C., thickness 2,000 Å, Dipole Referring to FIGS. 1 to 10, much difference in physical properties between a polymer (comparative synthesis example) including pure methacrylate and a norbornene derivative-introduced polymer (synthesis example) could be found. Accordingly, reaction of olefin and methacrylate may be poorly performed, however, norbornene within the methacrylate is partially replaced depending on an amount of the added norbornene to thereby form a polymer with new physical property acquired such that physical property of an existing pure methacrylate is changed. Also, it could be found that the norbornene may function to change a polymerization mechanism of the methacrylate to thereby form a polymer with physical property different from that of the polymer including the existing pure methacrylate. As shown in FIGS. 9 and 10, a resist using a polymer manufactured using methacrylate and olefin shows better line edge roughness. Also, as the line edge roughness becomes better, a resolution accordingly becomes better, and solubility with respect to a resist solvent becomes relatively better in comparison with the polymer including the existing pure methacrylate.

Also, a resist using the polymer of synthesis example may maintain the same excellent adhesion force as that of a conventional resist using the methacrylate. Accordingly, the reaction between the olefin and methacrylate is poorly performed, however, the olefin may participate in a reaction to change a physical property of the polymer as compared with a case of a polymer not using the olefin. In this instance, when the polymer with the changed physical property is used in the resist, the line edge roughness and resolution may be improved to thereby manufacture a resist with an excellent adhesion force.

The polymer of the present invention may be a block copolymer, a random copolymer, or a graft copolymer. The polymer represented as Chemical formula 1 may be polymerized by a typical method, however, a radical polymerization may be preferable for the polymerization. As examples of an initiator of the radical polymerization, azobis-isobutyronitrile (AIBN), benzoyl peroxide (BPO), lauryl peroxide, azo-bis-isobutyronitrile, azobis-isovaleronitrile, tert-butyl hydro peroxide, and the like may be given. A polymerization reaction may be performed by a bulk polymerization, solution polymerization, suspension polymerization, bulk-suspension polymerization, emulsion polymerization, and the like. Also, as examples of a polymerization solvent, benzene, toluene, xylene, halogenated benzene, diethyl ether, tetra hydro furan, esters, ethers, lactones, ketones, amides, and the like may be given. These polymerization solvents may be used alone or in combination of two or more thereof.

A polymerization temperature of polymers represented as Chemical formula 1 may be appropriately selected and used depending on type of a catalyst. A molecular weight distribution of the polymer may be appropriately controlled by changing a used amount and reaction time of a polymerization initiator. Residual monomers and by-products remaining in a reaction mixture after completion of the polymerization may be preferably removed by a precipitation method using a solvent.

A polystyrene conversion weight average molecular weight (hereinafter, referred to as 'Mw') of the polymer used in the present invention through GPC may be about 2,000 to 1,000,000. In this instance, the Mw may be preferably about 3,000 to 50,000 based on developing property, coating property, heat resistance, and the like as a photoresist. Also, the molecular weight distribution of the polymer may be preferably about 1.0 to 5.0, and in particular, preferably about 1.0 to 3.0.

Acid Generator

Onium salt-based iodonium salts, sulfonium salts, phosphonium salts, diazonium salts, pyridinium salts, imides, and the like may be used as an acid generator used in the composition for the chemically amplified resist.

As a preferable example of the acid generator, a compound of Chemical formula 2 or 3 may be given.

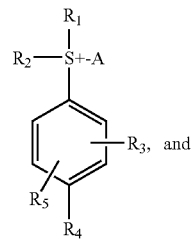

[Chemical formula 2]

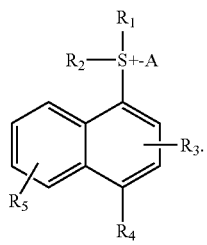

[Chemical formula 3]

In Chemical formulas 2 and 3, $R_1$ and $R_2$ respectively represent an alkyl group, an allyl group, a perfluoroalkyl group, a benzyl group, or an aryl group, $R_3$, $R_4$ and $R_5$ respectively represent hydrogen, an alkyl group, a halogen group, an alkoxy group, an aryl group, a thiophenoxy group, a thioalkoxy group, or an alkoxycarbonylmethoxy group, and A represents a fluorine containing compound.

Also, as examples of the fluorine containing compound A, $SO_2CF_3$, $OSO_2C_4F_9$, $OSO_2C_8F_{17}$, $N(CF_3)_2$, $N(C_2F_5)_2$, $N(C_4F_9)_2$, $C(CF_3)_3$, $C(C_2F_5)_3$, $C(C_4F_9)_3$, and the like may be given.

Also, in Chemical Formulas 2 and 3, as an example of −A, that is, a negative ion part, a compound represented as Chemical Formula 4 below may be given.

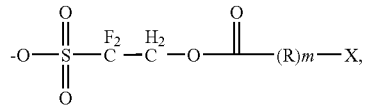

[Chemical formula 4]

wherein, X represents a mono-cyclic or poly-cyclic hydrocarbon with 3 and 30 carbon atoms, a benzyl group, or an aryl group; an alkyl group with 1 to 20 carbon atoms, an allyl group, a perfluoroalkyl group, a haloalkyl group, or an alkylsulfonyl group, the alkyl group being acquired by replacing at least one hydrogen with an ether group, an ester group, a carbonyl group, an acetal group, a nitryl group, a cyano group, a hydroxy group, a carboxyl group, or an aldehyde group; or a perfluoroalkyl group with 1 to 4 carbon atoms, wherein R represents an alkyl group with 1 to 10 carbon atoms, an alkoxy group with 1 to 10 carbon atoms, or a heteroatom selected from N, S, F and O, and wherein m represents an integer of 0 to 2.

Also, in Chemical formula 2 and 3, as specific examples of −A, that is, a negative ion part, compounds represented as Chemical formulas 5 to 31 below may be given.

[Chemical formulas 5 to 31] [chemical formulas 14, 15, and 16 are missing]
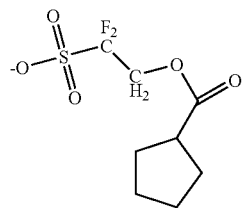 (5)
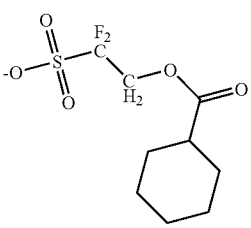 (6)
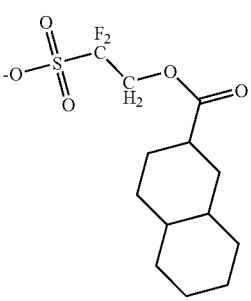 (7)
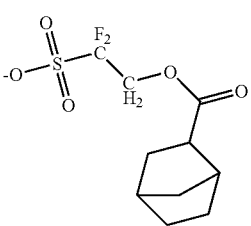 (8)
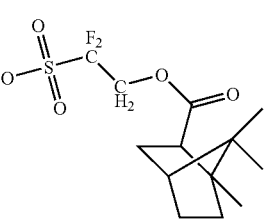 (9)
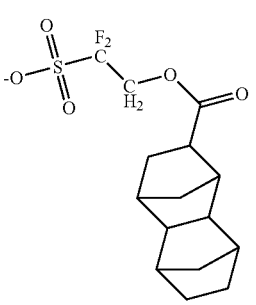 (10)
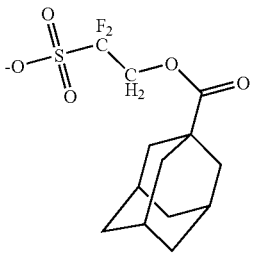 (11)
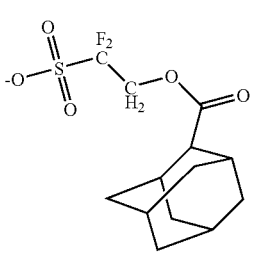 (12)
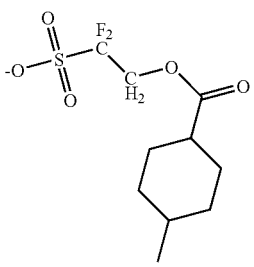 (13)
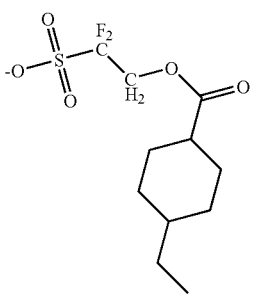 (14)
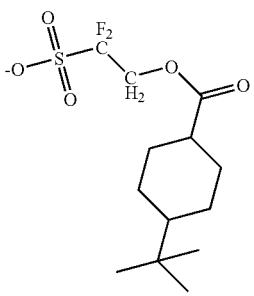 (15)

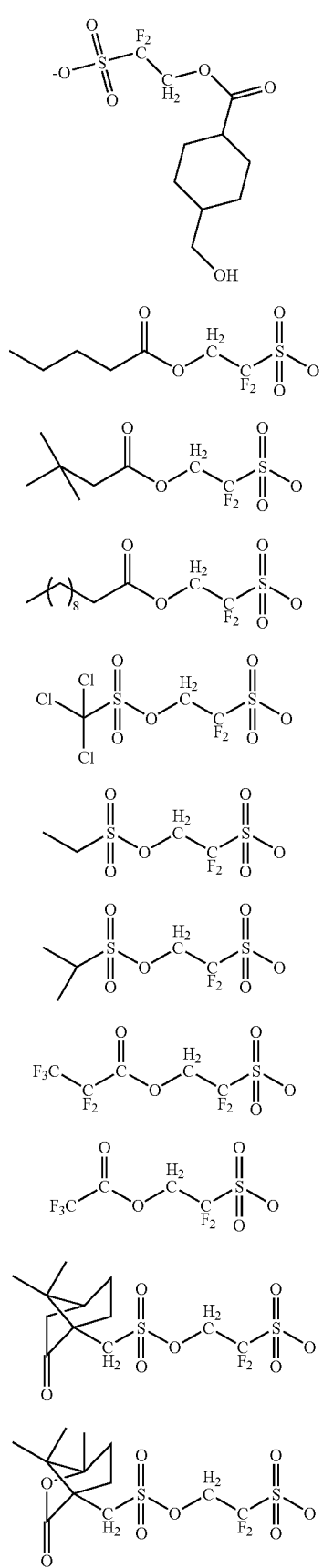
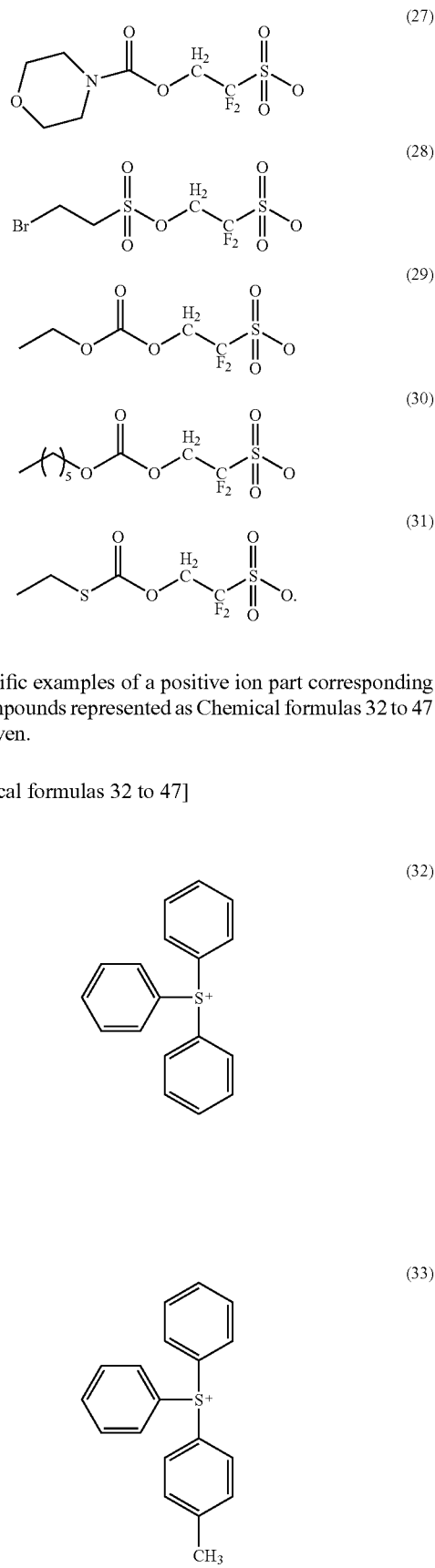
As specific examples of a positive ion part corresponding to −A, compounds represented as Chemical formulas 32 to 47 may be given.
[Chemical formulas 32 to 47]

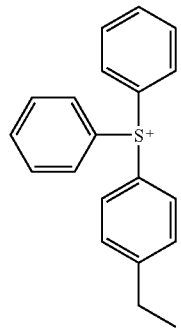
(34)
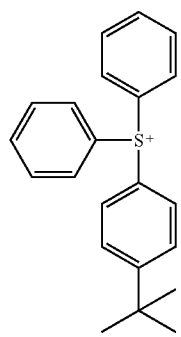
(35)
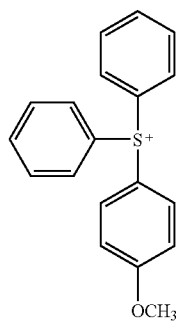
(36)
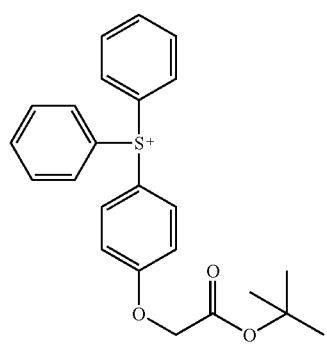
(37)
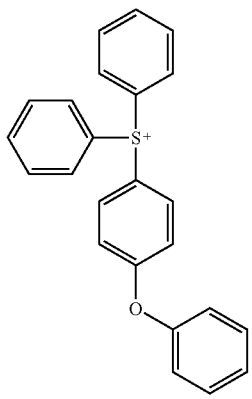
(38)
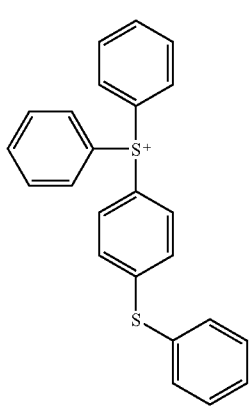
(39)
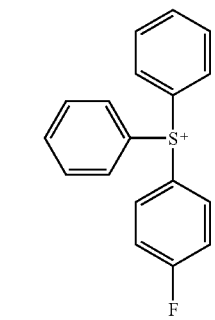
(40)
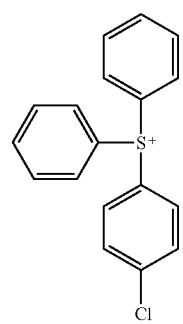
(41)

(42) 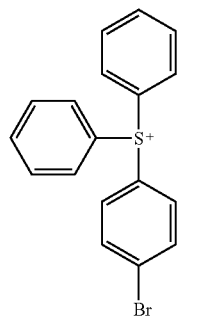

(43) 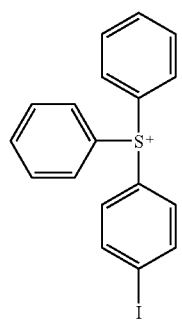

(44) 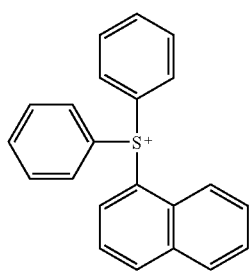

(45) 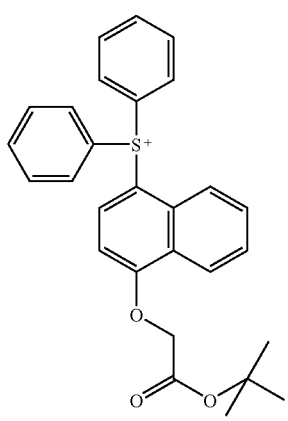

(46) 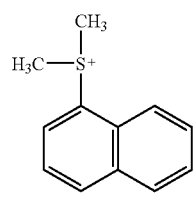

(47) 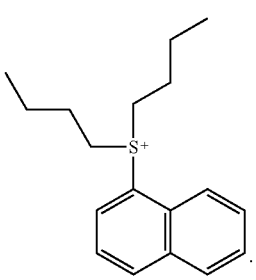

An amount of the acid generator of the composition for the chemically amplified resist is about 0.5 parts to 15 parts by weight based on about 100 parts by weight of an amount of the solid of the polymer. Verticality of a formed pattern is remarkably deteriorated when the amount of the acid generator is about 15 parts by weight or more, and flexibility of the pattern is deteriorated when the amount of the acid generator is about 5 parts by weight or less. The amount of the acid generator is preferably about 2 parts to 10 parts by weight based on the amount of the solid of the polymer. In this instance, the acid generator may be used alone or in combination of two or more thereof.

So that the composition for the chemically amplified resist according to the present exemplary embodiment acquires a uniform and smooth coating film, the composition dissolved in a solvent having an appropriate evaporation speed and viscosity may be used. As examples of the above mentioned solvent, ethylene glycol monomethyl ether, ethylene glycol monoethyl ether, ethylene glycol monopropyl ether, methyl cellosolve acetate, ethyl cellosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, and gamma-butyrolactone may be given. These solvents may be used alone or in combination of two or more thereof. A used amount of the solvent may be controlled so that the resist composition is uniformly formed on a wafer based on physical properties of the solvent such as volatile, viscosity, and the like. An amount of the solvent is preferably about 500 parts to 3000 parts by weight based on about 100 parts by weight of the solid of the polymer.

The composition for the chemically amplified resist according to the present invention is manufactured in a solution type, and the solution type composition is coated and dried on the wafer, thereby forming a resist painting layer. In this instance, in order to coat the composition on the wafer, a resist solution may be manufactured and filtered, and the filtered solution may be coated on the wafer by rotation coating, flowing coating, or roll coating method.

A radiation is required to be partially irradiated on the resist layer coated as described above in order to form a fine pattern. In this instance, the radiation may not be specifically limited, however, I-ray of ultraviolet, KrF excimer laser of far-ultraviolet, ArF excimer laser, F2 excimer laser, X-ray, electron-beam of charged particle beam, and the like may be selectively used depending on the type of the acid generator.

A developing solution may be selectively used from an aqueous solution containing sodium hydroxide, potassium hydroxide, sodium carbonate, sodium silicate, methane sodium silicate, ammonia water, methylamine, n-propylamine, triethylamine, tetramethyl ammonium hydroxide, tetraethyl ammonium hydroxide, and the like. Of theses, tetramethyl ammonium hydroxide may be preferably used. A surfactant, water-soluble alcohols, and the like may be used as an additive, as necessary.

The following Examples and Comparison Examples will illustrate the present invention in detail, but the present invention is not limited thereto.

Synthesis Example 1

About 10.0 g of 2-methyl 2-adamantyl methacrylate, about 7.3 g of γ-butyrolactyl methacrylate, and about 10.1 g of 3-hydroxy 1-adamantyl methacrylate of monomers for polymer were respectively dissolved in 31 g of 1,4-dioxane. Next, about 4 g of norbornene, about 2.0 g of azo-bis-isobutyronitrile (AIBN) acting as a polymerization initiator, and about 94.2 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction for about 16 hours was cooled to room temperature. The cooled solution was precipitated in hexane, and filtered. An obtained precipitation was cleansed with an identical solvent several times when filtering, and a reduced-pressure drying was performed, thereby obtaining about 21 g (67% of yield) of a polymer. A polystyrene conversion weight average molecular weight (hereinafter, referred to as 'Mw') of this polymer was about 8,840, and a molecular weight distribution (a ratio of a weight-average molecular weight to a number-average molecular weight of the polymer, Mw/Mn) was about 1.86. Also, the polymer manufactured in synthesis example 1 was a polymer corresponding to the polymer synthesized by the above-mentioned Equation 3. Accordingly, GPS data and NMR data of the polymer synthesized in synthesis example 1 are shown in FIGS. 3, 4, and 8. Chemical formula 48 below shows the polymer synthesized in synthesis example 1.

[Chemical formula 48]

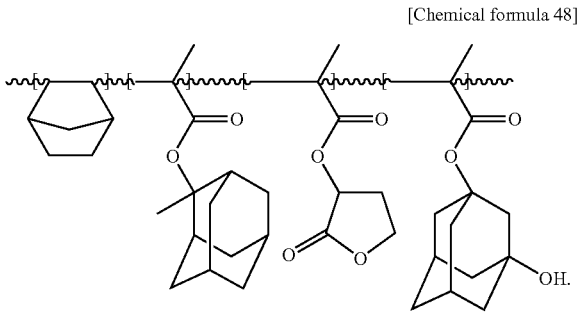

Synthesis Example 2

About 11.2 g of isopropyl adamantyl methacrylate, about 7.3 g of γ-butyrolactyl methacrylate, and about 10.1 g of 3-hydroxy 1-adamantyl methacrylate of monomers for polymer were respectively dissolved in about 28.6 g of 1,4-dioxane. Next, about 4 g of norbornene, about 2.0 g of AIBN acting as a polymerization initiator, and about 85.8 g of 1,4-dioxane acting as a polymerization solvent were inserted into a flask of about 250 ml, and then were stirred at room temperature for one hour under an atmosphere of nitrogen gas.

The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 22.1 g (68% of yield) of a polymer. A Mw of this polymer was about 7,810, and a Mw/Mn of the polymer was about 2.0. Chemical formula 49 below shows the polymer synthesized in synthesis example 2.

[Chemical formula 49]

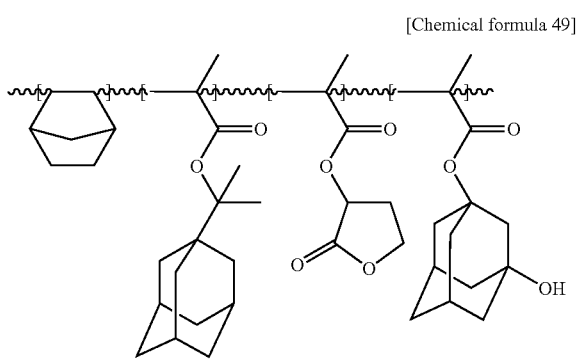

Figure 11:
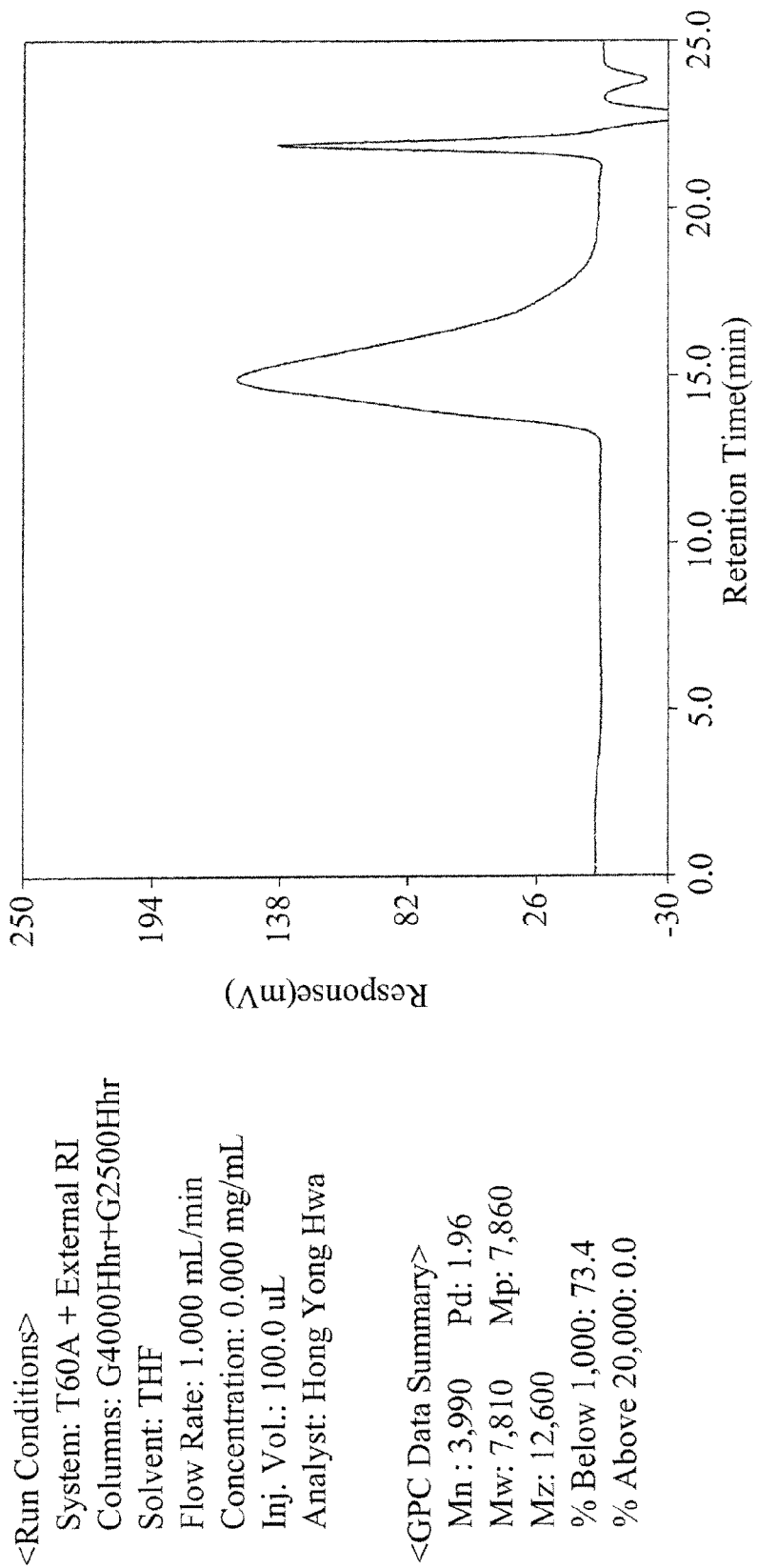
FIG. 11 is a diagram illustrating GPS data of a polymer synthesized in synthesis example 2.
Figure 12:
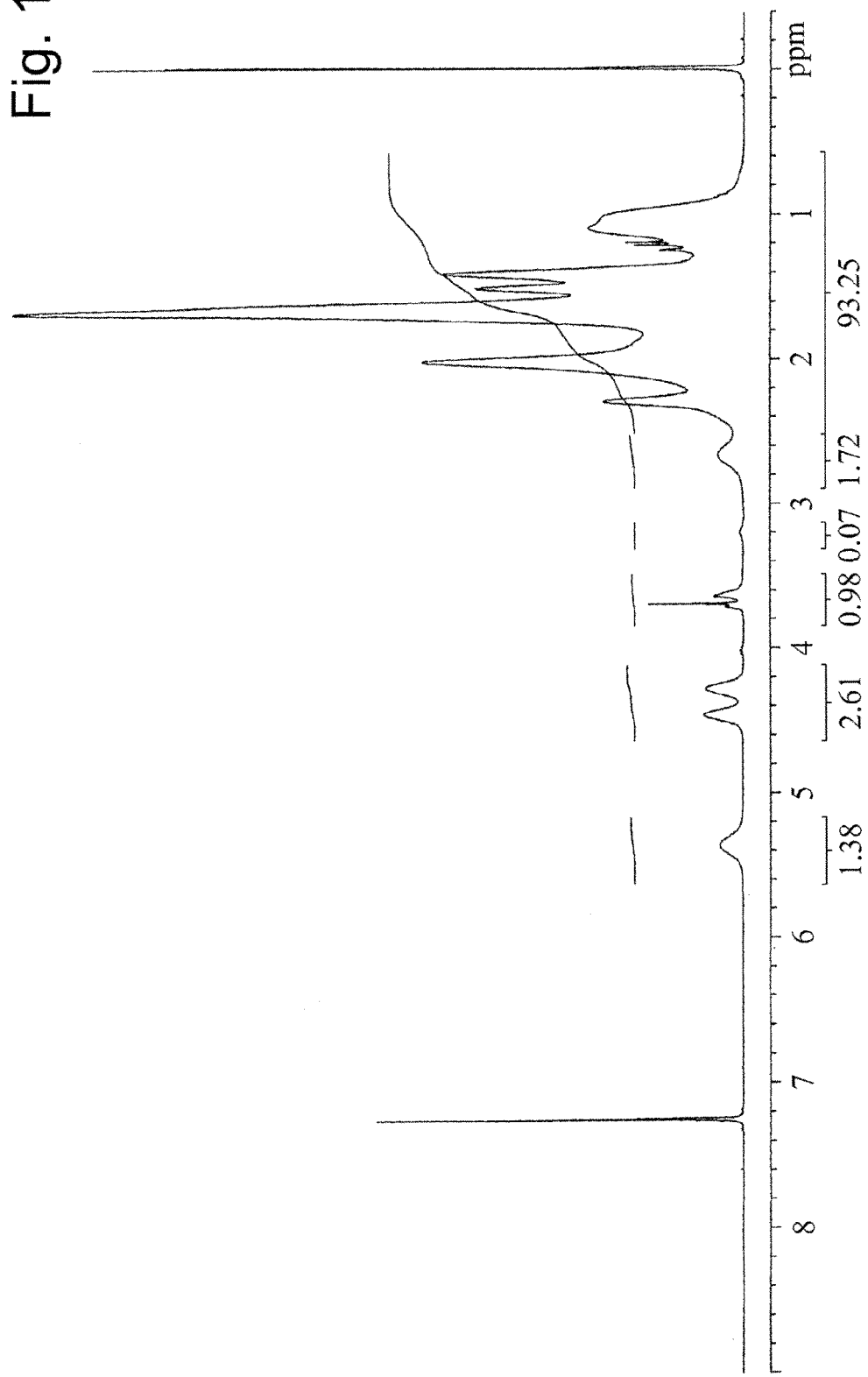
FIG. 12 is a diagram illustrating NMR data of a polymer synthesized in synthesis example 2.

FIG. 11 is a diagram illustrating GPS data of the polymer synthesized in synthesis example 2, and FIG. 12 is a diagram illustrating NMR data of the polymer synthesized in synthesis example 2.

Synthesis Example 3

About 10.0 g of 2-methyl 2-adamantyl methacrylate, about 9.5 g of 5-methacryloyloxy-2,6-norbornane carbolactone, and about 10.1 g of 3-hydroxy 1-adamantyl methacrylate of monomers for polymer were respectively dissolved in about 30 g of 1,4-dioxane. Next, about 4 g of norbornene, about 2.0 g of AIBN acting as a polymerization initiator, and about 89 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 23.7 g (80% of yield) of a polymer. A Mw of this polymer was about 7,530, and a Mw/Mn of the polymer was about 2.3. Chemical formula 50 below shows the polymer synthesized in synthesis example 3.

[Chemical formula 50]

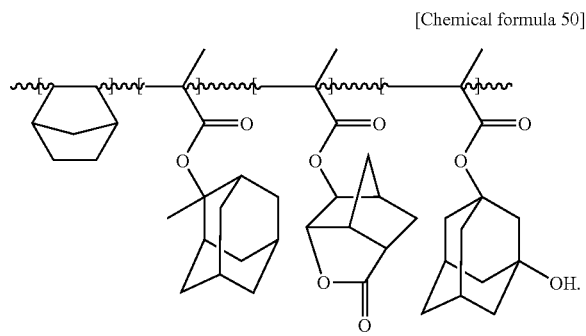

Figure 13:
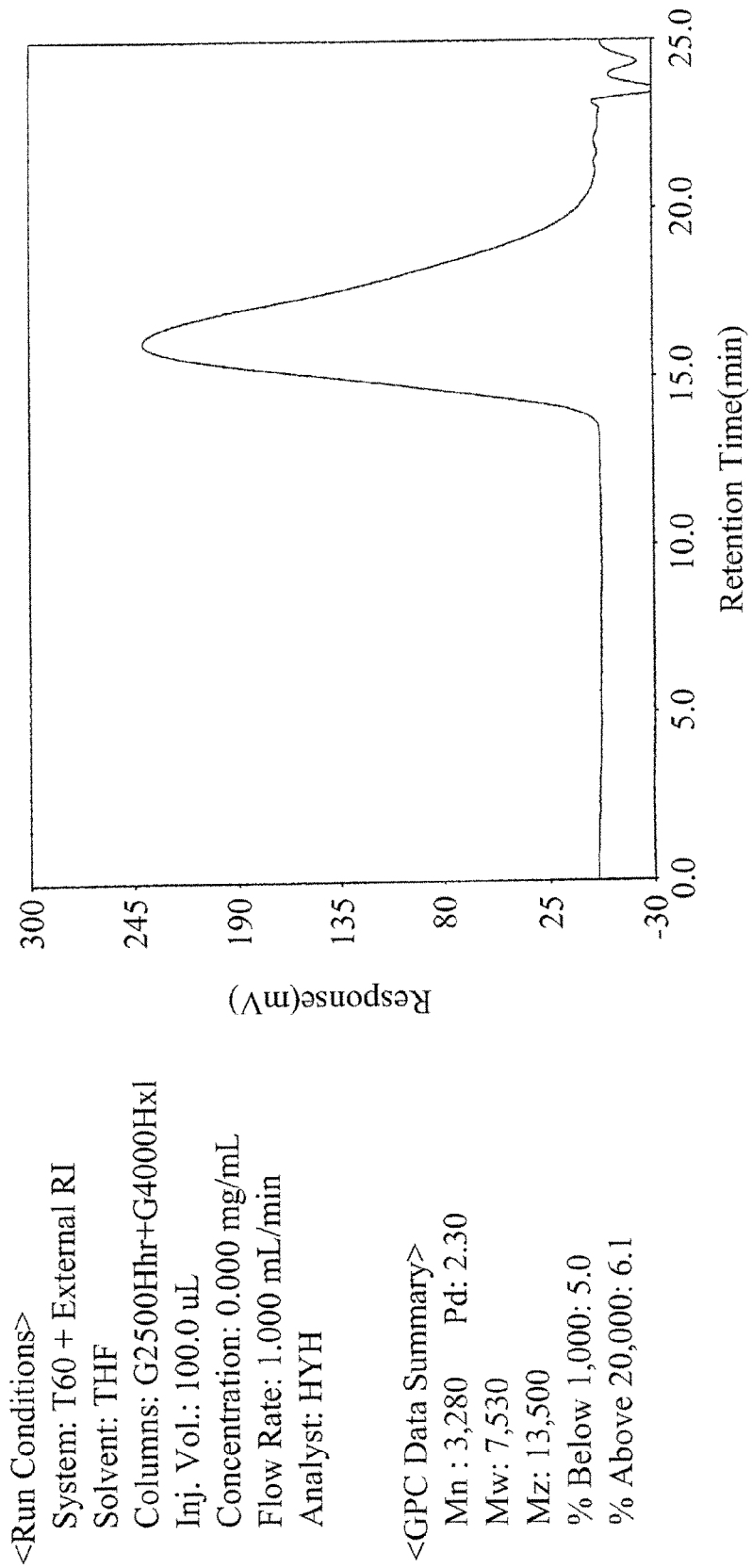
FIG. 13 is a diagram illustrating GPS data of a polymer synthesized in synthesis example 3.

FIG. 13 is a diagram illustrating GPS data of the polymer synthesized in synthesis example 3.

Synthesis Example 4

About 15.4 g of isopropyl adamantyl methacrylate, about 4.3 g of 2-ethyl-2-cyclopentyl methacrylate, about 10 g of γ-butyrolactyl methacrylate, and about 12.9 g of 1-adamantyl methacrylate of monomers for polymer were respectively dissolved in about 30.8 g of 1,4-dioxane. Next, about 6.6 g of norbornene, about 2.0 g of AIBN acting as a polymerization initiator, and about 91.4 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 31.8 g (65% of yield) of a polymer. A Mw of this polymer was about 9,210, and a Mw/Mn of the polymer was about 2.5. Chemical formula 51 below shows the polymer synthesized in synthesis example 4.

[Chemical formula 51]

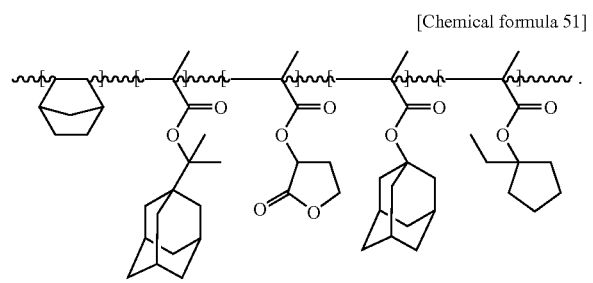

Figure 14:
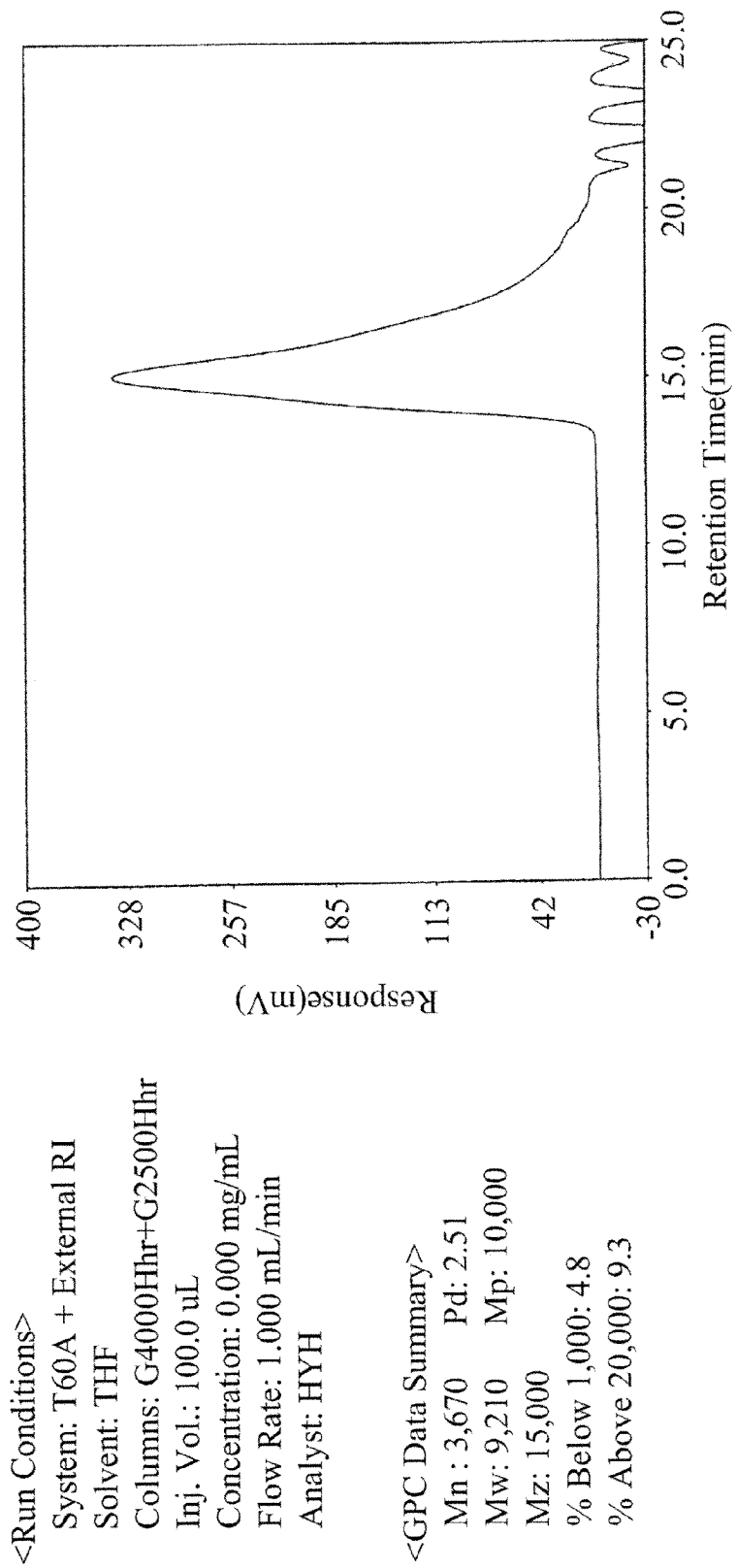
FIG. 14 is a diagram illustrating GPS data of a polymer synthesized in synthesis example 4.
Figure 15:
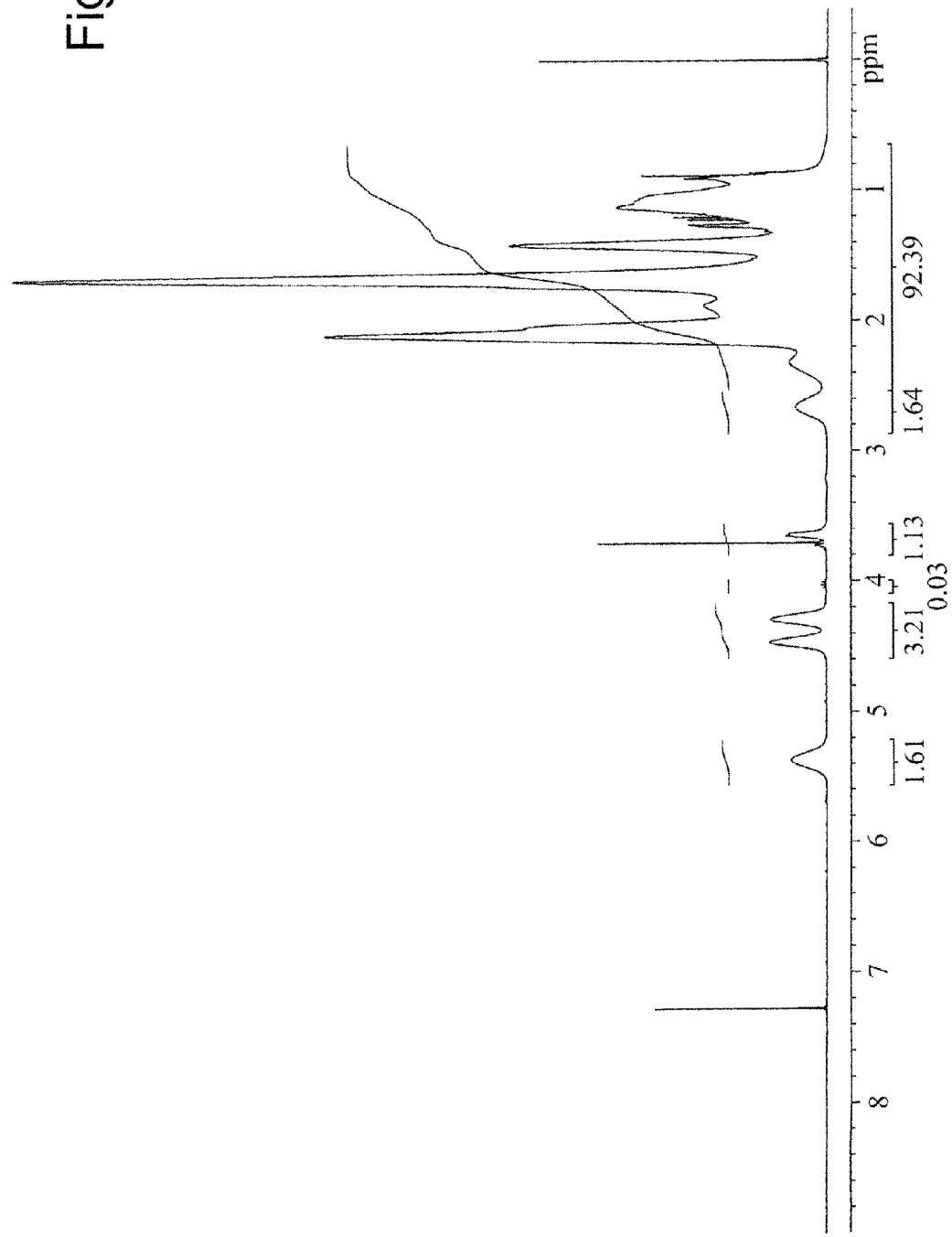
FIG. 15 is a diagram illustrating NMR data of a polymer synthesized in synthesis example 4.

FIG. 14 is a diagram illustrating GPS data of the polymer synthesized in synthesis example 4, and FIG. 15 is a diagram illustrating NMR data of the polymer synthesized in synthesis example 4.

Synthesis Example 5

About 7.3 g of isopropyl adamantyl methacrylate, about 9.5 g of 5-methacryloyloxy-2,6-norbornane carbolactone, and about 10.1 g of 3-hydroxy 1-adamantyl methacrylate of monomers for polymer were respectively dissolved in about 27 g of 1,4-dioxane. Next, about 4 g of norbornene, about 2.0 g of AIBN acting as a polymerization initiator, and about 81 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 25.6 g (83% of yield) of a polymer. A Mw of this polymer was about 7,340, and a Mw/Mn of the polymer was about 2.06. Chemical formula 52 below shows the polymer synthesized in synthesis example 5.

[Chemical formula 52]

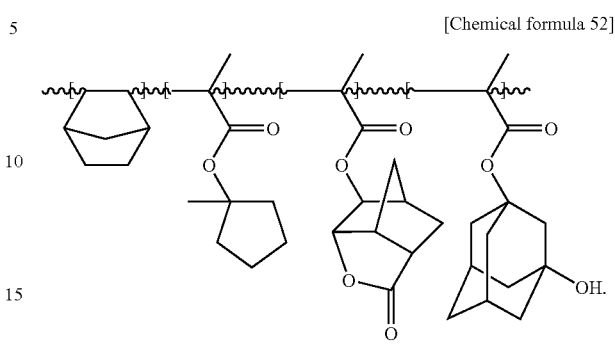

Figure 16:
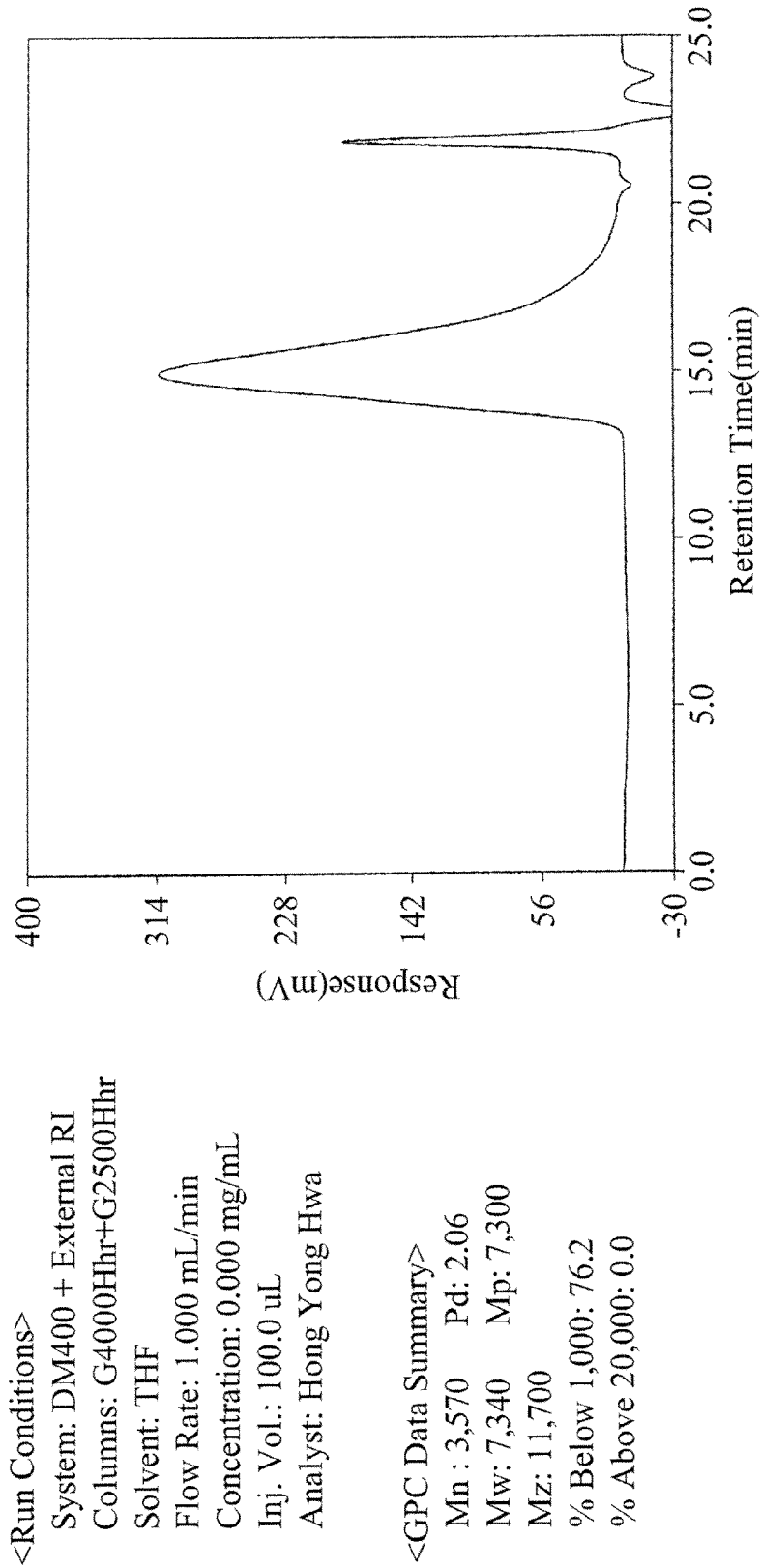
FIG. 16 is a diagram illustrating GPS data of a polymer synthesized in synthesis example 5.
Figure 17:
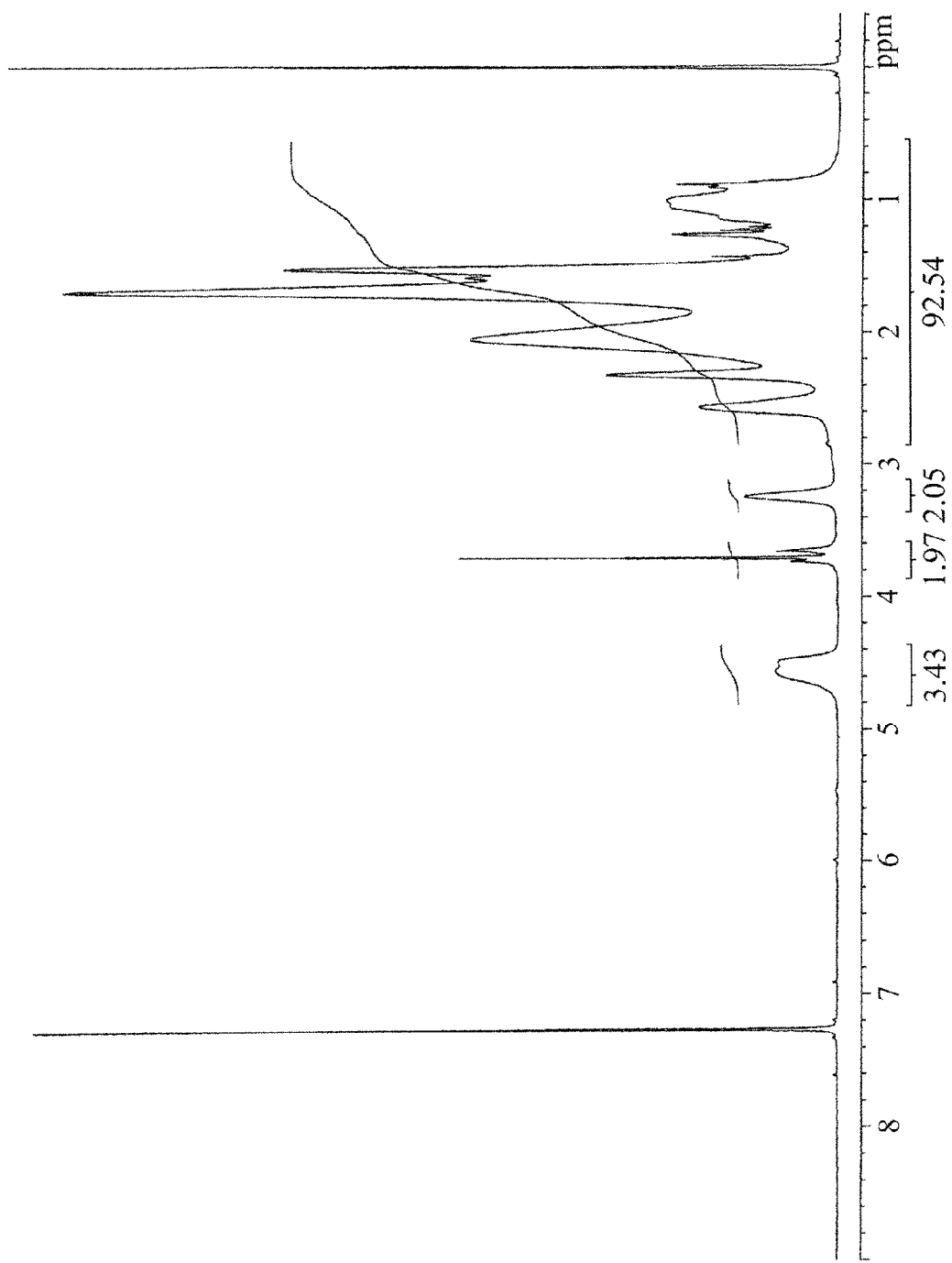
FIG. 17 is a diagram illustrating NMR data of a polymer synthesized in synthesis example 5.

FIG. 16 is a diagram illustrating GPS data of the polymer synthesized in synthesis example 5, and FIG. 17 is a diagram illustrating NMR data of the polymer synthesized in synthesis example 5.

Synthesis Example 6

About 10.0 g of 2-methyl 2-adamantyl methacrylate, about 7.3 g of γ-butyrolactyl methacrylate, and about 10.1 g of 3-hydroxy 1-adamantyl methacrylate of monomers for polymer were respectively dissolved in about 31 g of 1,4-dioxane. Next, about 10.2 g of 3-Bicyclo[2.2.1]hept-5-ene-2-yl-3-hydroxy-propionic-acid t-butyl ester, about 2.0 g of AIBN acting as a polymerization initiator, and about 93 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 21.4 g (57% of yield) of a polymer. A Mw of this polymer was about 6,460, and a Mw/Mn of the polymer was about 1.7. Chemical formula 53 below shows the polymer synthesized in synthesis example 6.

[Chemical formula 53]

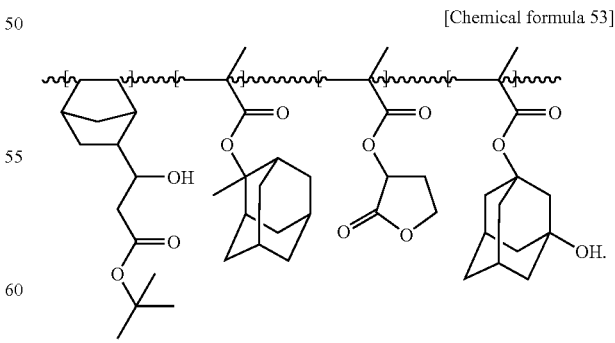

Figure 18:
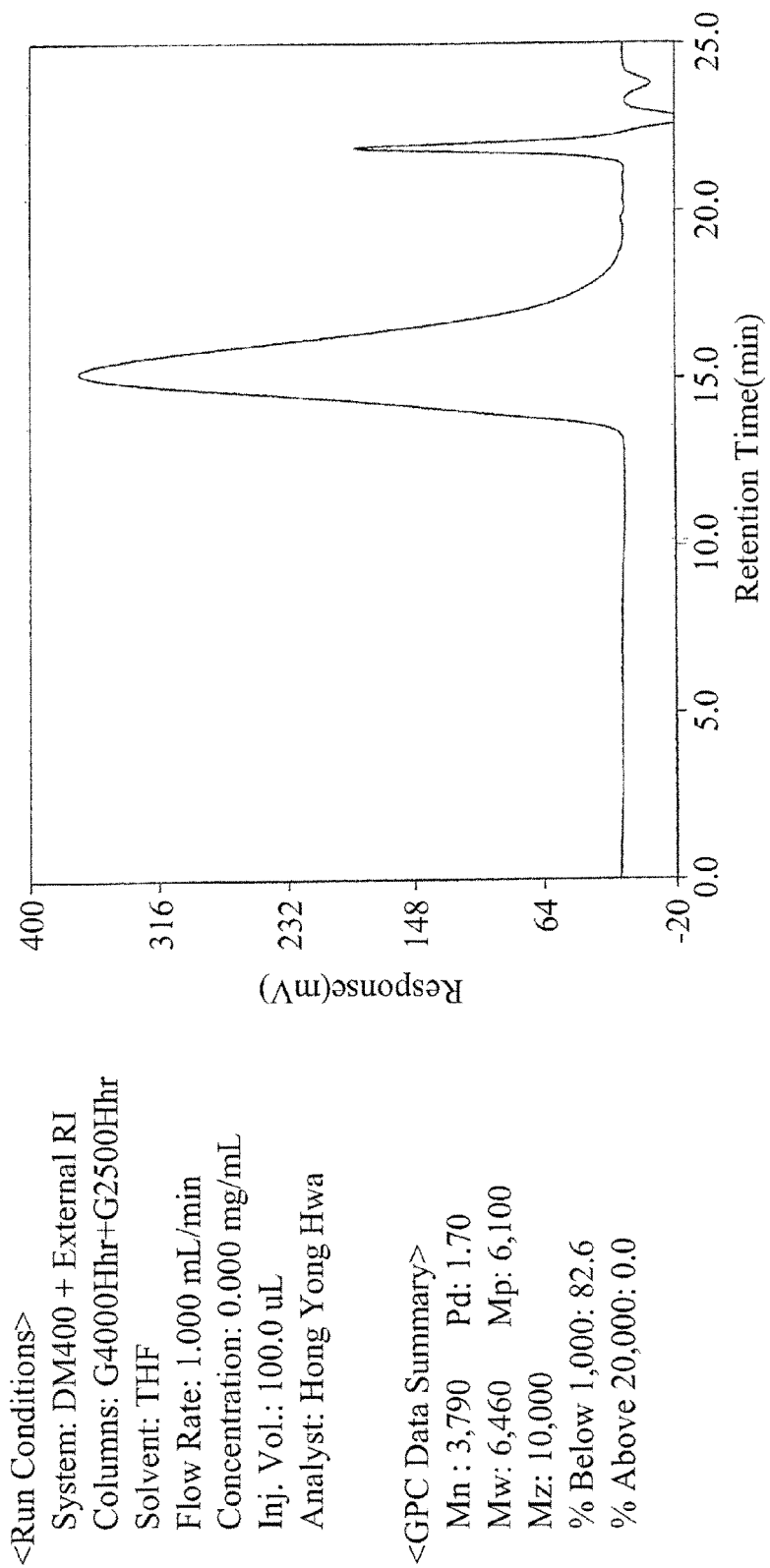
FIG. 18 is a diagram illustrating GPS data of a polymer synthesized in synthesis example 6.
Figure 19:
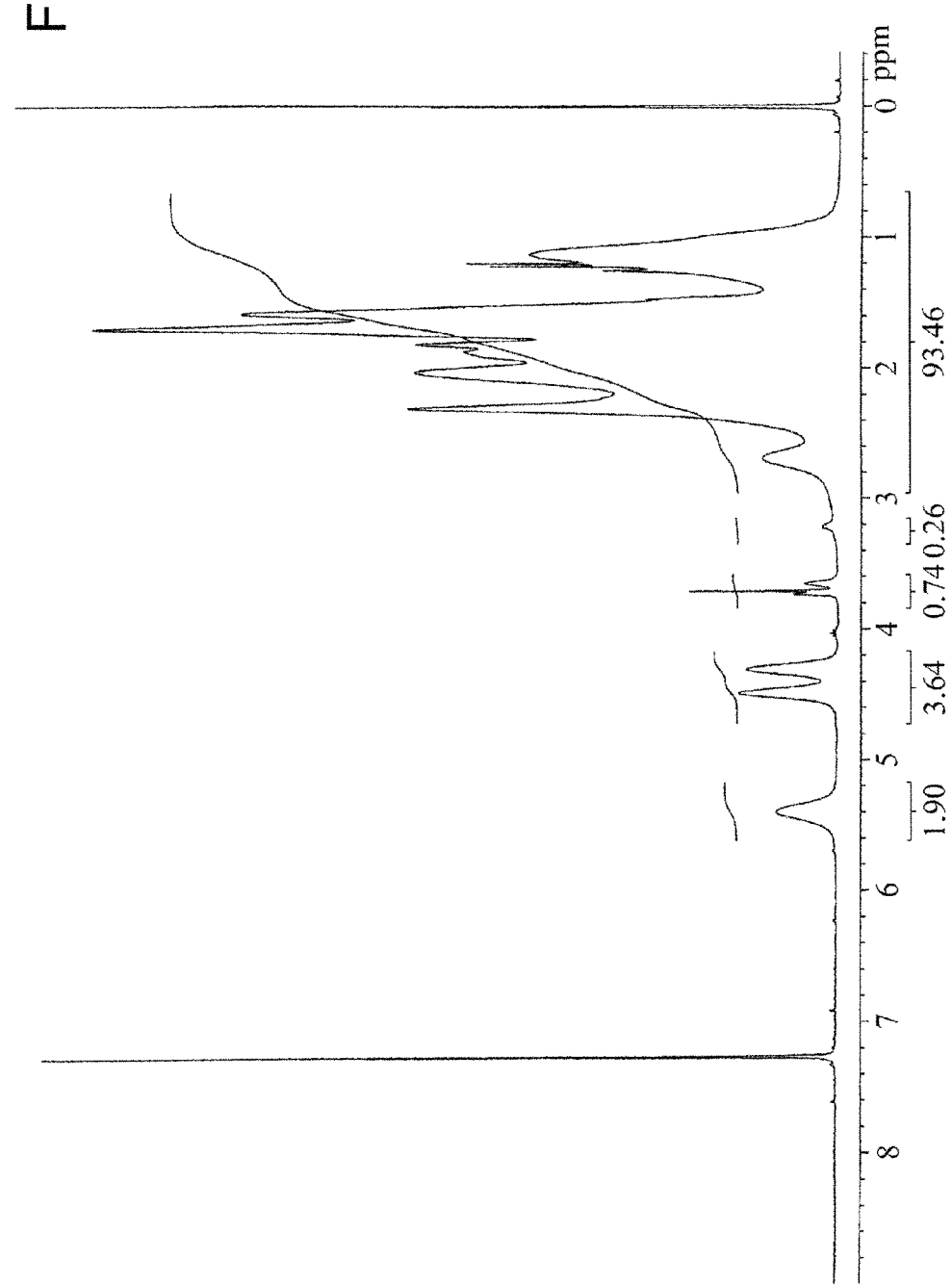
FIG. 19 is a diagram illustrating NMR data of a polymer synthesized in synthesis example 6.

FIG. 18 is a diagram illustrating GPS data of the polymer synthesized in synthesis example 6, and FIG. 19 is a diagram illustrating NMR data of the polymer synthesized in synthesis example 6.

Synthesis Example 7

About 10.0 g of 2-methyl 2-adamantyl methacrylate, and about 9.5 g of 5-methacryloyloxy-2,6-norbornane carbolactone of monomers for polymer were respectively dissolved in about 20 g of 1,4-dioxane. Next, about 4 g of norbornene, about 2.0 g of AIBN acting as a polymerization initiator, and about 60 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 14.6 g (62% of yield) of a polymer. A Mw of this polymer was about 2,800, and a Mw/Mn of the polymer was about 1.68. Chemical formula 54 below shows the polymer synthesized in synthesis example 7.

[Chemical formula 54]

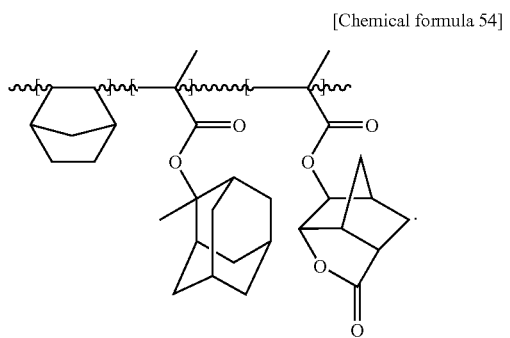

Figure 20:
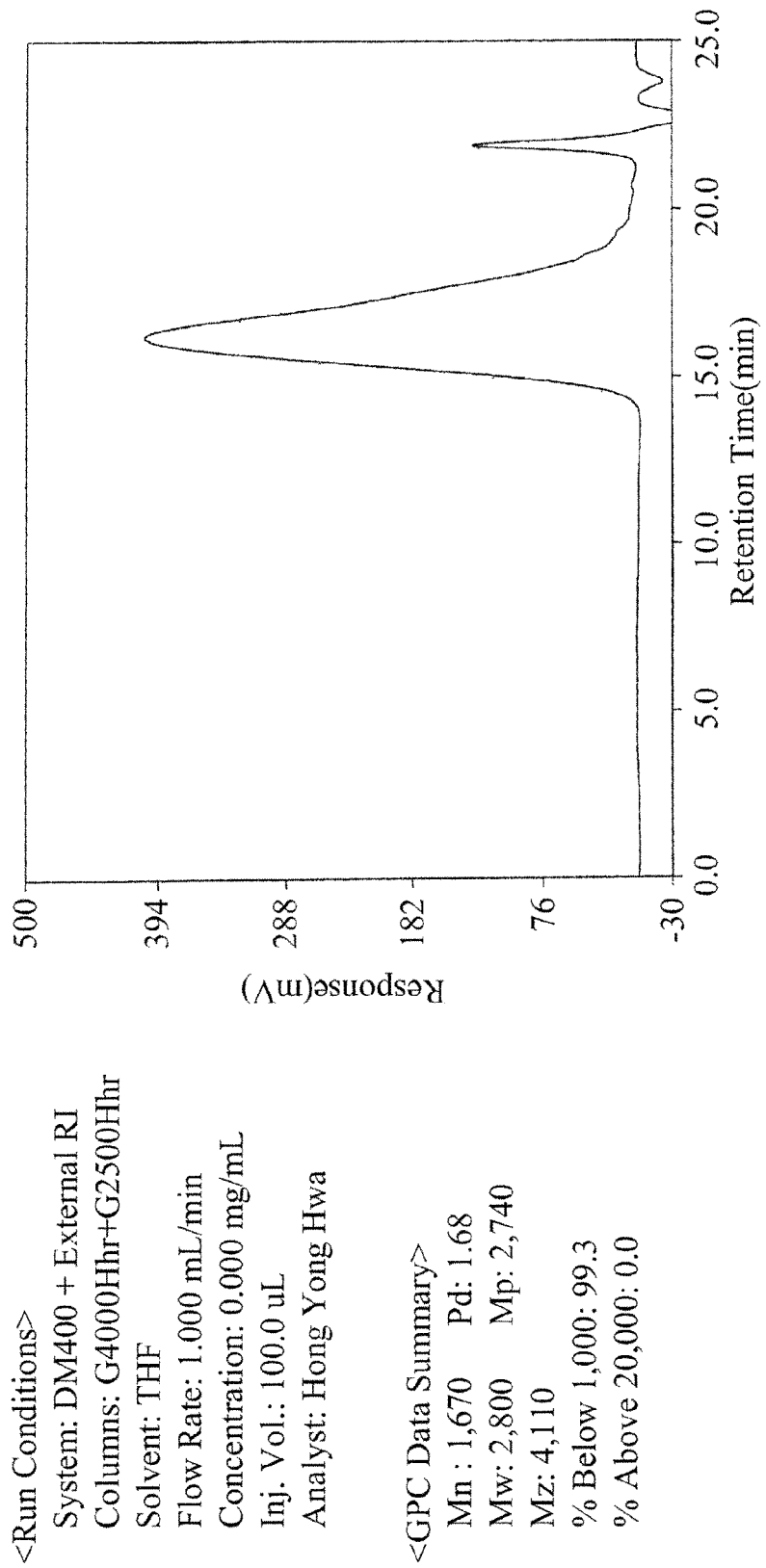
FIG. 20 is a diagram illustrating GPS data of a polymer synthesized in synthesis example 7.
Figure 21:
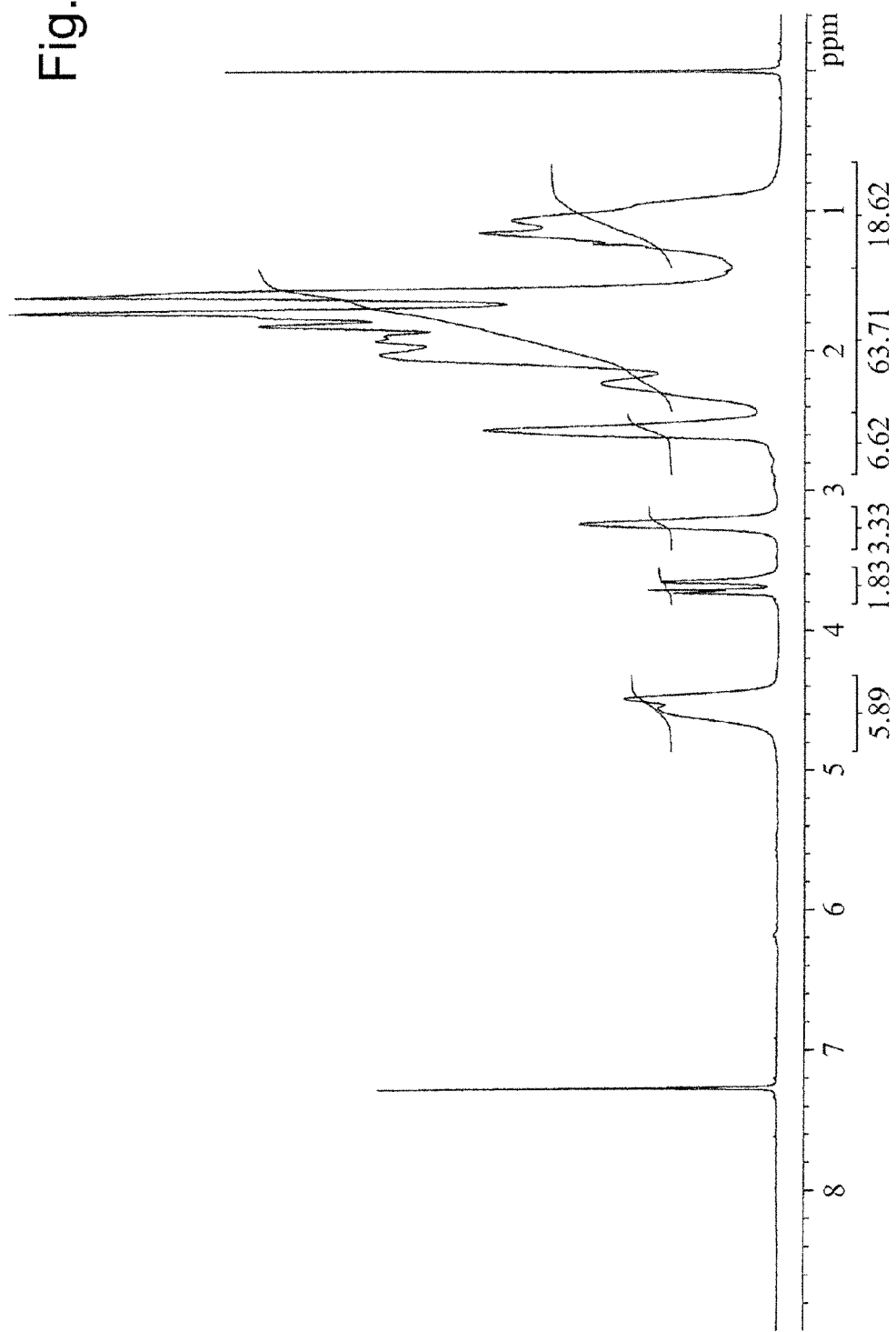
FIG. 21 is a diagram illustrating NMR data of a polymer synthesized in synthesis example 7.

FIG. 20 is a diagram illustrating GPS data of the polymer synthesized in synthesis example 7, and FIG. 21 is a diagram illustrating NMR data of the polymer synthesized in synthesis example 7.

Synthesis Example 8

About 10.0 g of 2-methyl 2-adamantyl methacrylate, about 7.3 g of γ-butyrolactyl methacrylate, about 10.1 g of 3-hydroxy 1-adamantyl methacrylate, and about 7.3 g of 2-methyl-2-cyclopentyl methacrylate of monomers for polymer were respectively dissolved in about 34.7 g of 1,4-dioxane. Next, about 4 g of norbornene, about 2.0 g of AIBN acting as a polymerization initiator, and about 104 g of 1,4-dioxane acting as a polymerization solvent were inserted into a flask of about 250 ml, and then were stirred at room temperature for one hour under an atmosphere of nitrogen gas. The monomers for polymer dissolved in a beaker were gradually added for one hour while maintaining a temperature of a reactor to be about 65° C., and a solution where polymerization was completed through a reaction of about for 16 hours was cooled to room temperature. The cooled solution was precipitated in hexane, and filtered. An obtained precipitation was cleansed with an identical solvent several times when filtering, and a reduced-pressure drying was performed, thereby obtaining about 31 g (80% of yield) of a polymer represented as above Chemical formula 12. A Mw of this polymer was about 6,680, and a Mw/Mn of the polymer was about 2.4. Chemical formula 55 below shows the polymer synthesized in synthesis example 8.

[Chemical formula 55]

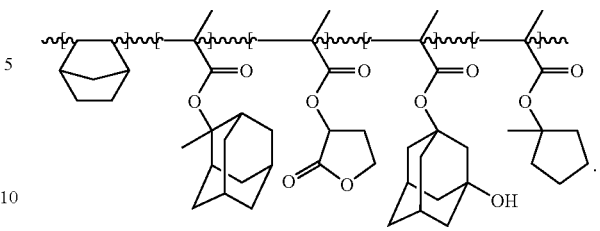

Figure 22:
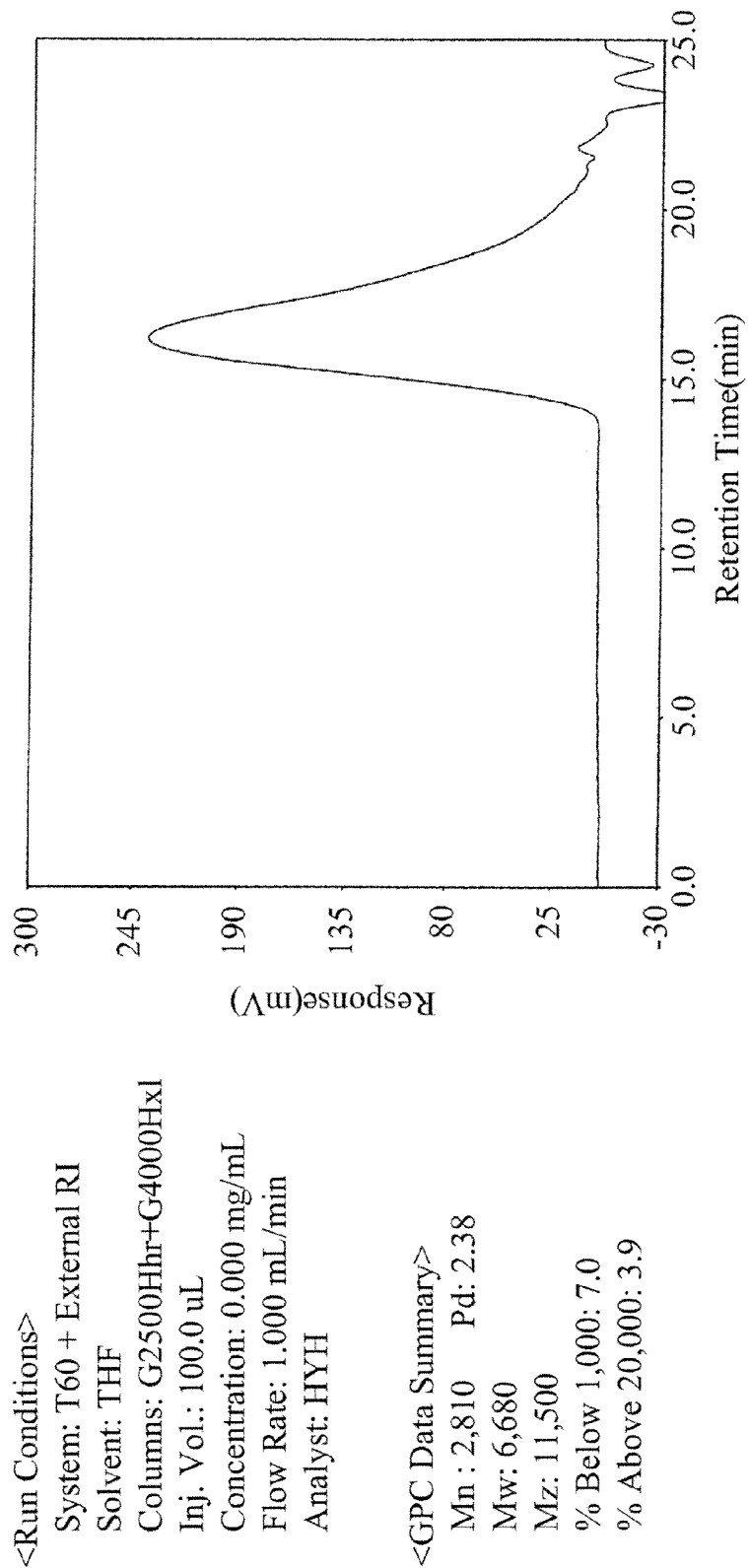
FIG. 22 is a diagram illustrating GPS data of a polymer synthesized in synthesis example 8.
Figure 23:
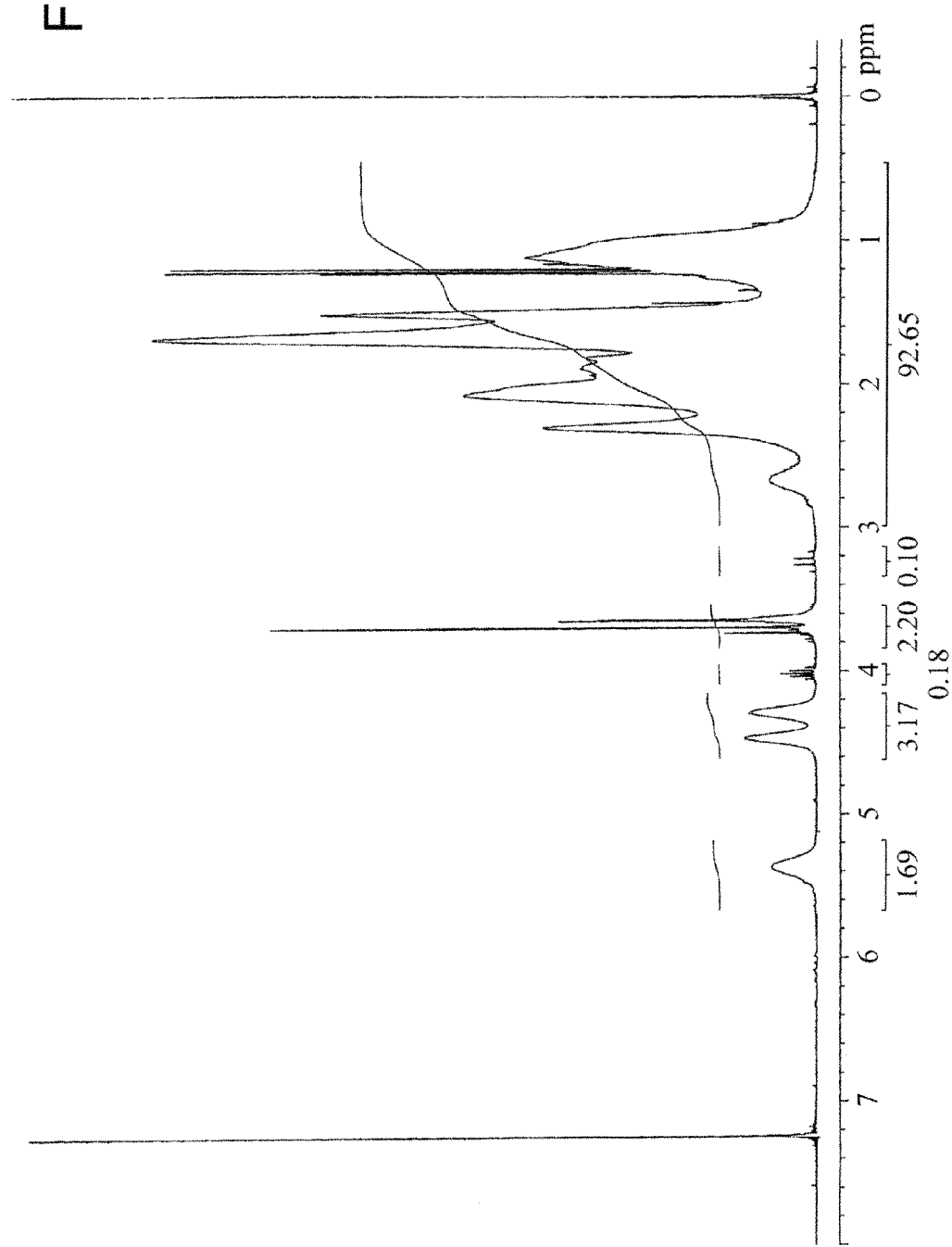
FIG. 23 is a diagram illustrating NMR data of a polymer synthesized in synthesis example 8.

FIG. 22 is a diagram illustrating GPS data of the polymer synthesized in synthesis example 8, and FIG. 23 is a diagram illustrating NMR data of the polymer synthesized in synthesis example 8.

Comparative Synthesis Example 1

About 10.0 g of 2-methyl 2-adamantyl methacrylate, about 7.3 g of γ-butyrolactyl methacrylate, and about 10.1 g of 3-hydroxy 1-adamantyl methacrylate of monomers for polymer were respectively mixed and dissolved in about 82 g of 1,4-dioxane, and then a temperature of a bath was gradually heated to about 65° C. A solution where polymerization was completed through a reaction of about for 16 hours while maintaining a temperature of a reactor to be about 65° C. was cooled to room temperature. The cooled solution was precipitated in hexane, and filtered. An obtained precipitation was cleansed with an identical solvent several times when filtering, and a reduced-pressure drying was performed, thereby obtaining about 23.3 g (85% of yield) of a polymer. A Mw of this polymer was about 8,610 and a Mw/Mn of the polymer was about 2.28. Chemical formula 56 below shows the polymer synthesized in synthesis example 8.

[Chemical formula 56]

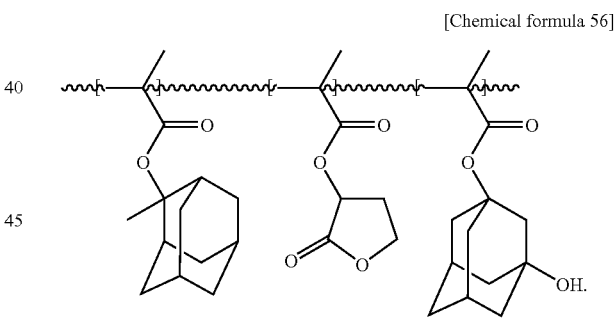

Figure 24:
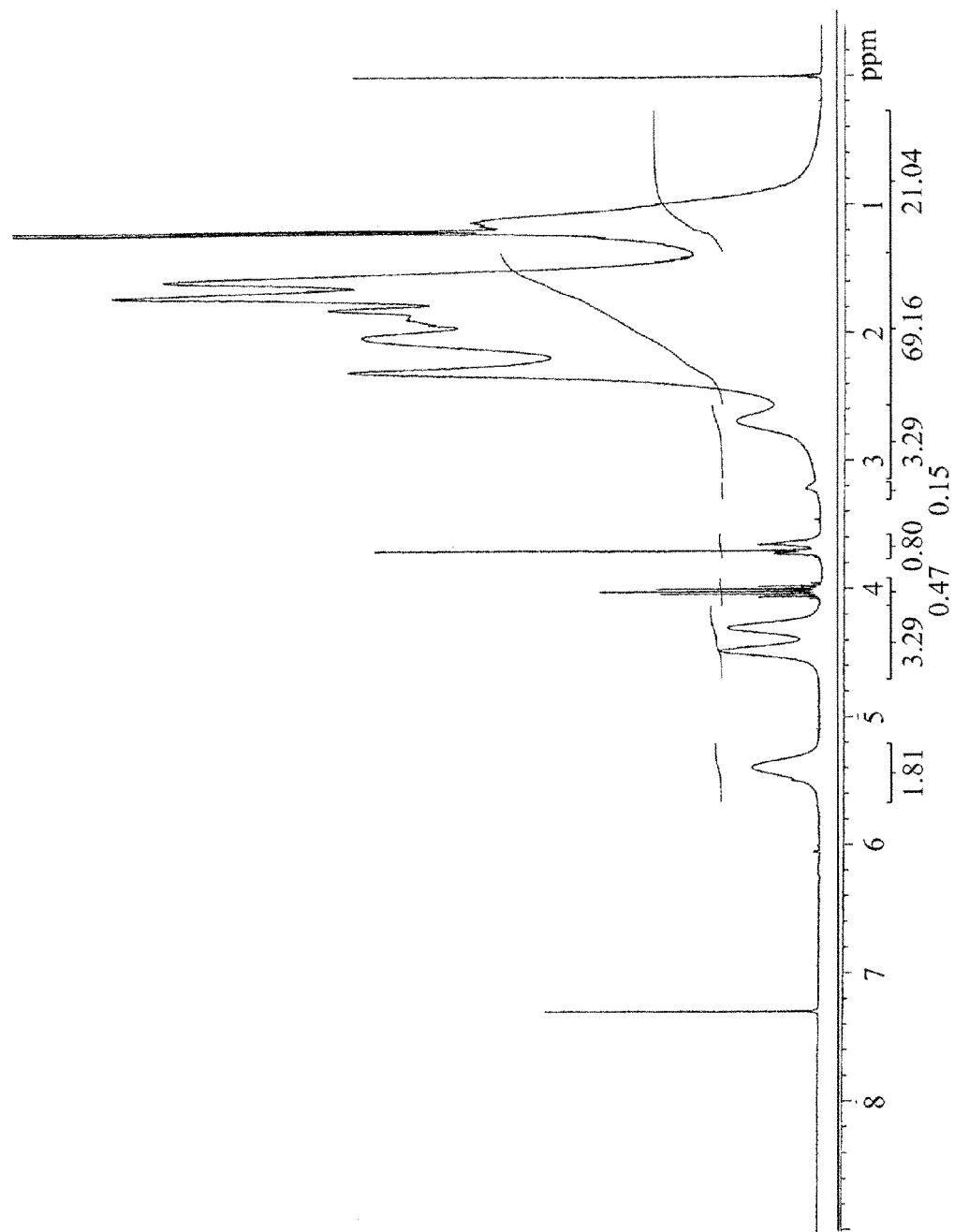
FIG. 24 is a diagram illustrating GPS data of a polymer synthesized in comparative synthesis example 1.
Figure 25:
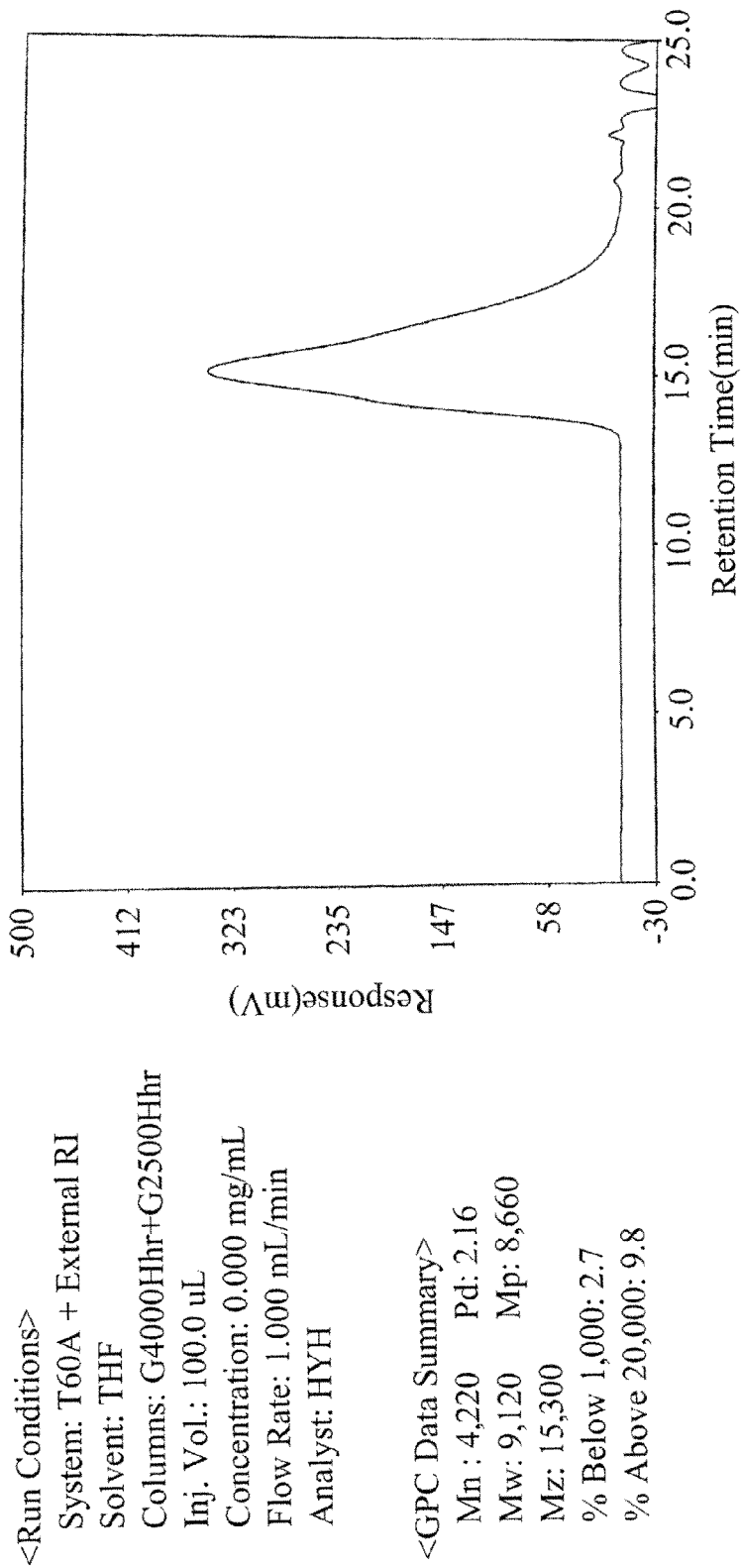
FIG. 25 is a diagram illustrating NMR data of a polymer synthesized in comparative synthesis example 1.

FIG. 24 is a diagram illustrating GPS data of the polymer synthesized in comparative synthesis example 1, and FIG. 25 is a diagram illustrating NMR data of the polymer synthesized in comparative synthesis example 1.

Manufacture and Estimation of Resist

Example 1

About 2.5 parts by weight of triphenyl sulfonium nonaflate acting as an acid generator, and about 0.75 parts by weight of tetramethyl ammonium hydroxy acting as a basic additive based on about 100 parts by weight of the polymer obtained in synthesis example 1 were dissolved in about 1,000 parts by weight of propylene glycol methyl ether acetate, and then filtered using a membrane filter of about 0.2 μm, thereby manufacturing a resist composition. The obtained resist composition was coated on a substrate using a spinner, and dried at about 110° C. for about 60 seconds, thereby forming a film having about 0.2 μm. The formed film was exposed using an ArF excimer laser stepper (lens numerical aperture: 0.78), and then subjected to a heat treatment at about 110° C. for about 60 seconds. Subsequently, the film was developed for about 40 seconds using a tetramethyl ammonium hydroxide aqueous solution of about 2.38 wt %, cleansed, and dried, thereby forming a resist pattern. Developing property of the tetramethyl ammonium hydroxide aqueous solution and adhesive property of the formed resist pattern with respect to the substrate were excellent, and a resolution of the formed resist pattern was about 0.08 μm and a sensitivity thereof was about 68 mJ/cm². A line edge roughness of the manufactured resist was measured using CD-SEM, and a degree of the line edge roughness was divided into five levels, which are 1 (significantly bad), 2 (bad), 3 (medial), 4 (good), and 5 (significantly good). Also, in a case of the sensitivity, an exposure forming a Line and Space (L/S) pattern of about 0.10 μm formed after the developing to be a pattern with a line width of 1:1 may represent an optimum exposure, the optimum exposure represent the sensitivity, and the developed minimum pattern size represent a resolution.

Examples 2 to 10

A resist composition shown in Table 1 below was manufactured in the same manner as that in above Example 1, other than using a composition as shown in Table 1 below, a positive resist pattern was formed, various estimation for physical properties was performed, and the results are shown in Table 1 below.

TABLE 1

| Amount (wt %) | Polymer | Acid generator (1) | Basic additive (2) | Sensitivity (mJ/cm²) | Resolution (nm) | LER |
|---|---|---|---|---|---|---|
| Example 2 | Chemical formula 48 (100) | 2.5 | 0.75 | 69 | 80 | 4 |
| Example 3 | Chemical formula 49 (100) | 2.5 | 0.75 | 67 | 90 | 4 |
| Example 4 | Chemical formula 53 (100) | 2.5 | 0.75 | 69.5 | 90 | 3 |
| Example 5 | Chemical formula 48 (100) | 3.0 | 0.75 | 65 | 90 | 4 |
| Example 6 | Chemical formula 49 (100) | 3.0 | 0.75 | 63 | 80 | 5 |
| Example 7 | Chemical formula 53 (100) | 3.0 | 0.75 | 65 | 90 | 3 |
| Example 8 | Chemical formula 48 (100) | 3.0 | 1 | 68 | 80 | 4 |
| Example 9 | Chemical formula 49 (100) | 3.0 | 1 | 67 | 100 | 3 |
| Example 10 | Chemical formula 53 (100) | 3.0 | 1 | 69 | 80 | 4 |

(notice)
(1) acid generator: Triphenylsulfonium nonaflate (PAG)
(2) basic additive: Tetra methyl ammonium hydroxide As shown in Table 1, the line edge roughness and developing property of the resist pattern obtained in the respective Examples were excellent.

Comparative Examples 1 to 3

A resist composition was manufactured in the same manner as that in Example 1 using a composition shown in Table 2 below, except for using a pure methacrylate polymer synthesized in Comparative Example 1. The obtained respective compositions were exposed using the ArF excimer laser exposure stepper (lens numerical aperture: 0.75) to thereby form a positive resist pattern in the same manner as that in Example 1, various estimations were performed, and then the results are shown in Table 2 below.

TABLE 2

| Amount (wt %) | Polymer | Acid generator (1) | Basic additive (2) | Sensitivity (mJ/cm²) | Resolution (μm) | LER |
|---|---|---|---|---|---|---|
| Comparative Example 1 | Chemical formula 13 (100) | 2.5 | 0.75 | 75 | 110 | 2 |
| Comparative Example 2 | Chemical formula 13 (100) | 3.0 | 0.75 | 75 | 100 | 1 |
| Comparative Example 3 | Chemical formula 13 (100) | 3.0 | 1 | 78 | 110 | 2 |

(notice)
(1) acid generator: Triphenylsulfonium nonaflate (PAG)
(2) basic additive: Tetra methyl ammonium hydroxide As shown in Table 2, according to estimation results of Comparative Examples, the resolution was significantly reduced in comparison with Table 1, and the line edge roughness was significantly reduced in the pattern of L/S.

As described above, according to the present invention, there is provided the polymer for a chemically amplified resist which are excellent in etching resistance, and also excellent in solubility with respect to a resist solvent. Accordingly, a patterning performance excellent in transparency, sensitivity, resolution, and developing property may be achieved when the resist composition manufactured using the polymer is applicable in a semiconductor process.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A composition for a chemically amplified resist comprising:
about 100 parts by weight of a polymer represented as

[Chemical formula 1]

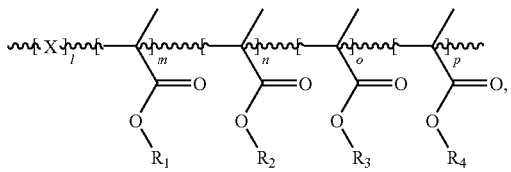

wherein, X represents a norbornene derivative, $R_1$, $R_2$, $R_3$, and $R_4$ represent an alkyl group with 1 to 30 carbon atoms containing at least one functional group of a hydrogen atom, an ether group, an ester group, a carbonyl group, an acetal group, an epoxy group, a nitryl group (—CN), and an aldehyde group, l, m, n, o and p respectively represent repeating units, l represents a real number of 0.05 to 0.5, m and n respectively represent real numbers of 0.1 to 0.7, o and p respectively represent real numbers of 0 to 0.7, and a sum of l, m, n, o and p is 1;

about 0.5 to 15 parts by weight of an acid generator represented as

[Chemical formula 3]

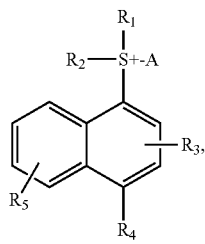

wherein, $R_5$ and $R_6$ respectively represent an alkyl group, an allyl group, a perfluoroalkyl group, a benzyl group, or an aryl group, $R_7$, $R_8$ and $R_9$ respectively represent hydrogen, an alkyl group, a halogen group, an alkoxy group, an aryl group, a thiophenoxy group, a thioalkoxy group, or an alkoxycarbonylmethoxy group, and A is selected from the group consisting of $N(CF_3)_2$, $N(C_2F_6)_2$, and $N(C_4F_9)_2$;

about 0.1 to 5 parts by weight of a base additive; and
about 500 to 3000 parts by weight of solvent.

2. The composition for chemically amplified resist of claim 1, wherein the solvent includes at least one element selected from a group consisting of ethylene glycol monomethyl ether, ethylene glycol monoethyl ether, ethylene glycol monopropyl ether, methyl cellosolve acetate, ethyl cellosolve acetate, propylene glycol monomethyl ether acetate, propylene glycol monoethyl ether acetate, propylene glycol monopropyl ether acetate, methyl isopropyl ketone, cyclohexanone, methyl 2-hydroxypropionate, ethyl 2-hydroxypropionate, 2-heptanone, ethyl lactate, and gamma-butyrolactone.

3. The composition for a chemically amplified resist of claim 1, wherein the base additive comprises tetra methyl ammonium hydroxide.

4. The composition for a chemically amplified resist of claim 1, further comprising a solvent.

5. The composition for a chemically amplified resist of claim 1, wherein the norbornene derivative does not include an electron withdrawing functional group in a double bond location of a norbornene precursor monomer.

6. The composition for a chemically amplified resist of claim 5, wherein the electron withdrawing functional group not present in the double bond location of the norbornene precursors monomer comprises
a halogen group, —CN,
a nitrogroup (—$NO_2$),
a trifluoromethyl group (—$CF_3$), and
a sulfonyl group (—$SO_2$).

* * * * *